United States Patent
Xie et al.

(10) Patent No.: US 10,177,041 B2
(45) Date of Patent: Jan. 8, 2019

(54) FIN-TYPE FIELD EFFECT TRANSISTORS (FINFETS) WITH REPLACEMENT METAL GATES AND METHODS

(71) Applicant: GLOBALFOUNDRIES INC., Grand Cayman (KY)

(72) Inventors: Ruilong Xie, Schenectady, NY (US); Laertis Economikos, Wappingers Falls, NY (US); Chanro Park, Clifton Park, NY (US); Min Gyu Sung, Latham, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 4 days.

(21) Appl. No.: 15/455,203

(22) Filed: Mar. 10, 2017

(65) Prior Publication Data
US 2018/0261514 A1    Sep. 13, 2018

(51) Int. Cl.
*H01L 21/8238* (2006.01)
*H01L 21/324* (2006.01)
*H01L 29/66* (2006.01)
*H01L 27/092* (2006.01)
*H01L 29/78* (2006.01)

(52) U.S. Cl.
CPC .... *H01L 21/823828* (2013.01); *H01L 21/324* (2013.01); *H01L 21/823821* (2013.01); *H01L 21/823878* (2013.01); *H01L 27/0924* (2013.01); *H01L 29/66545* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | |
|---|---|---|
| 9,064,932 B1 | 6/2015 | Pham et al. |
| 9,373,641 B2 | 6/2016 | Anderson et al. |
| 9,391,164 B2 | 7/2016 | Ando et al. |
| 2010/0041236 A1 | 2/2010 | Lin et al. |
| 2011/0086504 A1 | 4/2011 | Huang et al. |
| 2013/0270644 A1 | 10/2013 | Anderson et al. |
| 2015/0340461 A1 | 11/2015 | Wei et al. |
| 2016/0133363 A1 | 5/2016 | Fujita et al. |
| 2017/0025526 A1* | 1/2017 | Cho ............ H01L 29/66545 |
| 2017/0222020 A1* | 8/2017 | Yu ............... H01L 29/42384 |

* cited by examiner

*Primary Examiner* — Charles D Garber
*Assistant Examiner* — Xiaoming Liu
(74) *Attorney, Agent, or Firm* — Gibb & Riley, LLC; Francois Pagette

(57) ABSTRACT

Disclosed are method embodiments for forming an integrated circuit (IC) structure with at least one first-type FINFET and at least one second-type FINFET, wherein the first-type FINFET has a first replacement metal gate (RMG) adjacent to a first semiconductor fin, the second-type FINFET has a second RMG adjacent to a second semiconductor fin, and the first RMG is in end-to-end alignment with the second RMG and physically and electrically isolated from the second RMG by a dielectric column. The method embodiments minimize the risk of the occurrence defects within the RMGs by forming the dielectric column during formation of the first and second RMGs and, particularly, after deposition and anneal of a gate dielectric layer for the first and second RMGs, but before deposition of at least one of multiple work function metal layers. Also disclosed herein are IC structure embodiments formed according to the above-described method embodiments.

19 Claims, 29 Drawing Sheets

FIN-TYPE FIELD EFFECT TRANSISTORS (FINFETS) WITH REPLACEMENT METAL GATES AND METHODS

BACKGROUND

Field of the Invention

The present invention relates to integrated circuits (ICs) and, more particularly, to methods of forming an IC structure that incorporates at least two adjacent fin-type field effect transistors (FINFETs) with discrete replacement metal gates (RMGs).

Description of Related Art

In integrated circuit design, cells (also referred to as library elements) typically represent a set of devices (e.g., a set of fin-type field effect transistors (FINFETs)) and the interconnect structure(s) that connect those devices. An exemplary cell can incorporate multiple parallel semiconductor fins, including at least one first semiconductor fin for at least one first-type FINFET (e.g., a P-type FINFET) and at least one second semiconductor fin for at least one second-type FINFET (e.g., an N-type FINFET). Such a cell can also incorporate an isolation region in the area between the first semiconductor fin(s) and the second semiconductor fin(s), a first gate structure that traverses the first semiconductor fin(s), and a second gate structure, which is in end-to-end alignment with the first gate structure and which traverses the second semiconductor fin(s). The first gate structure can have a first work function for optimal performance of the first-type FINFET and the second gate structure can have a second work function for optimal performance of the second-type FINFET. The first gate structure can abut the second gate structure such that these gate structures are physically and electrically connected. Alternatively, the first gate structure and the second gate structure can be physically separated and electrically isolated by a dielectric region.

Historically, when a design includes two gate structures that are in end-to-end alignment and physically and electrically isolated from each other, as described above, the gate structures would simply be lithographically patterned and etched from a gate stack including a silicon oxide gate dielectric layer and a doped polysilicon gate conductor layer. Gate sidewall spacers and interlayer (ILD) material provide the required electrical isolation between the gate structures. Recently, designs have been developed that include two replacement metal gates (RMGs) that are in end-to-end alignment and physically and electrically isolated. Those skilled in the art will recognize that a RMG is typically formed by forming sacrificial gate structures for each FINFET (e.g., using lithographic patterning and etch techniques) and subsequently replacing the sacrificial gate structures with RMGs, each of which includes a high-K gate dielectric layer and a gate conductor layer made of one or more work function metal layers and a conductive fill material layer. Again, gate sidewall spacers and interlayer (ILD) material provide the required electrical isolation between the gate structures. However, as designs are developed that include smaller devices and an increase device density, it has become increasingly difficult to pattern such gate structure without the occurrence of defects that can impact device performance.

SUMMARY

In view of the foregoing, disclosed herein is an improved method of forming an integrated circuit (IC) structure with at least one first-type FINFET (e.g., a P-type FINFET) and at least one second-type FINFET (e.g., an N-type FINFET), wherein the first-type FINFET has a first replacement metal gate (RMG) adjacent to at least one first semiconductor fin, wherein the second-type FINFET has a second RMG adjacent to at least one second semiconductor fin, and wherein the first RMG is in end-to-end alignment with the second RMG and physically and electrically isolated from the second RMG by a dielectric column.

Generally, the method includes selectively removing a previously formed sacrificial gate to create a gate opening that exposes at least a first channel region of a first semiconductor fin and a second channel region of a second semiconductor fin. In the gate opening, the first RMG is formed adjacent to the first channel region, the second RMG is formed adjacent to the second channel region and the dielectric column is formed between the first replacement metal gate and the second replacement metal gate. In the method, the dielectric column is specifically formed during formation of the first RMG and the second RMG (i.e., while the first RMG and the second RMG are also being formed). More particularly, the dielectric column is formed after deposition and anneal of a gate dielectric layer for the first RMG and the second RMG, but before deposition of at least one of multiple work function metal layers.

For example, a first embodiment of the method includes selectively removing a previously formed sacrificial gate to create a gate opening that exposes at least a first channel region of a first semiconductor fin and a second channel region of a second semiconductor and subsequently forming, in the gate opening, a first RMG adjacent to the first channel region, the second RMG adjacent to the second channel region and the dielectric column between the first replacement metal gate and the second replacement metal gate. In this first embodiment, the dielectric column is formed after deposition and anneal of a gate dielectric layer for the first RMG and the second RMG, but before deposition of any work function metal layers.

A second embodiment of the method can similarly include selectively removing a previously formed sacrificial gate to create a gate opening that exposes at least a first channel region of a first semiconductor fin and a second channel region of a second semiconductor fin and subsequently forming, in the gate opening, a first RMG adjacent to the first channel region, the second RMG adjacent to the second channel region and the dielectric column between the first replacement metal gate and the second replacement metal gate. However, in this second embodiment, the dielectric column is formed after deposition and anneal of a gate dielectric layer for the first RMG and the second RMG and after deposition of a first work function metal layer on the gate dielectric layer, but before deposition of a second work function metal layer.

In any case, by forming the dielectric column after deposition and anneal of the gate dielectric layer, but before deposition of one or more of the multiple work function metal layers, the method minimizes the risk of the occurrence defects within the first RMG and the second RMG, even with relatively small devices and a relatively high device density.

Also disclosed herein are embodiments of an integrate circuit (IC) structure formed according to the above-described method. The IC structure can include a first-type FINFET (e.g., a P-type FINFET) and a second-type FINFET (e.g., an N-type FINFET). The first-type FINFET can include at least one first semiconductor fin with a first channel region and, adjacent to the first channel region, a first replacement metal gate (RMG). The second-type FIN-FET can include at least one second semiconductor fin with a second channel region and, adjacent to the second channel region, a second RMG. The first RMG can be in end-to-end alignment with the second RMG. Additionally, the first RMG can can be physically separated and electrically isolated from the second RMG by a dielectric column, which has a first side and a second side opposite the first side.

The first RMG can include portions of a gate dielectric layer, a first work function metal layer, a second work function metal layer, and a conductive fill material layer and each of the portions of the various layers can have surfaces immediately adjacent to a first side of the dielectric column. The second RMG can include additional portions of the same layers except for the first work function metal layer. That is, the second RMG can include additional portions of the gate dielectric layer, the second work function metal layer and the conductive fill material layer and each of the additional portions of the various layers can have surfaces immediately adjacent to the second side of the dielectric column. Furthermore, the additional portion of the second work function metal layer within the second RMG can specifically have a segment, which is essentially parallel and immediately adjacent to the second side of the dielectric column and which extends from the top surface of the gate dielectric layer to above the level of the top surface of the second semiconductor fin. In other words, the additional portion of the second work function metal layer within the second RMG can have a segment, which extends essentially vertically along the second side of the dielectric column and which has a height that is greater than the height of the second semiconductor fin.

It should be noted that the configuration of the first RMG varies depending upon the embodiment. For example, the portion of the first work function metal layer within the first RMG can have a segment, which is essentially parallel and immediately adjacent to the first side of the dielectric column and which extends from the top surface of the gate dielectric layer to above the level of the top surface of the first semiconductor fin. In other words, the portion of the first work function metal layer with the first RMG can have a segment, which extends essentially vertically along the first side of the dielectric column and which has a height that is greater than the height of the first semiconductor fin. Alternatively, the portion of the first work function metal layer within the first RMG can have an end that abuts the first side of the dielectric column.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1A:
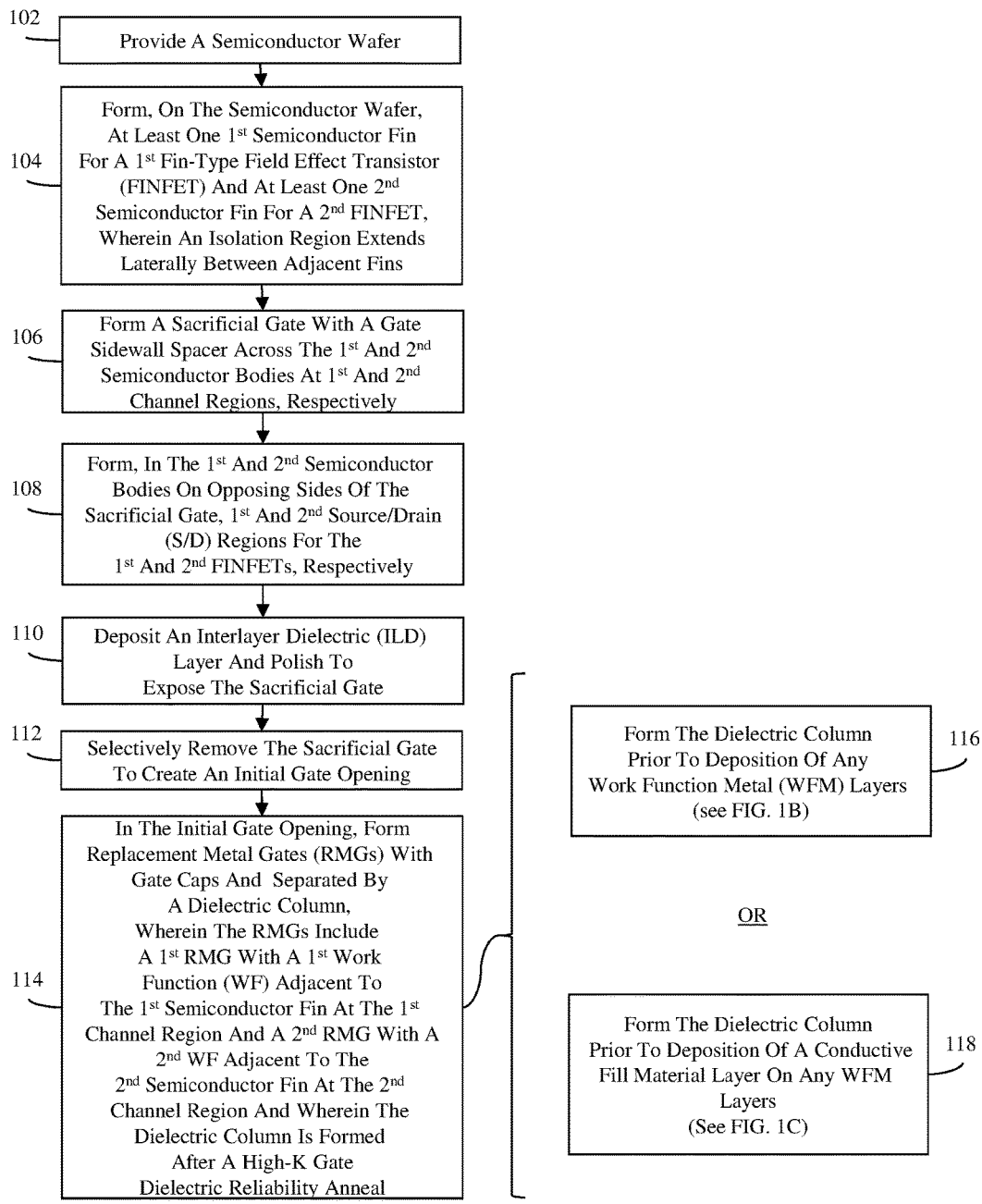
FIGS. 1A-1C show a flow diagram illustrating embodiments of a method of forming an integrated circuit (IC) structure.

As mentioned above, as designs are developed that include smaller devices and an increase device density, it has become increasingly difficult to pattern discrete gate structures without the occurrence of defects that can impact device performance. In response, gate cut techniques have been developed for use in replacement metal gate (RMG) processing. Specifically, rather than forming discrete sacrificial gate structures for each FINFET and subsequently replacing the sacrificial gate structures with RMGs, a single sacrificial gate structure can be formed across first semiconductor fin(s) for a first fin-type field effect transistor (FINFET) and also across second semiconductor fin(s) for a second FINFET. Following formation of the sacrificial gate structure, a gate sidewall spacer can be formed on the sidewalls of the gate structure and an interlayer dielectric (ILD) layer can be deposited over the sacrificial gate structure and portions of the semiconductor fins that extend laterally beyond the sacrificial gate structure. The ILD layer can subsequently be planarized to expose the top surface of the sacrificial gate structure and the sacrificial gate structure can be selectively removed, thereby creating a gate opening. A continuous RMG structure can then be formed in the gate opening. The continuous RMG can have a first section with a first work function adjacent to the first semiconductor fin(s) and can have a second section with a second work function adjacent to the second semiconductor fin(s). Subsequently, a gate cut trench can be formed at the interface between the two gate sections and, particularly, above an isolation region between the first semiconductor fin(s) and the second semiconductor fin(s). The gate cut trench can be filled with a dielectric material to form a dielectric column that provides the required electrical isolation between the first section and the second section. However, forming a gate cut trench through a RMG that includes multiple layers of various different materials can result in the formation of deep divots in the adjacent ILD material. Relatively large divots can cause a number of potential problems in the final structure. For example, they can subsequently be filled with metal and, thus, can increase the likelihood of device failure due to shorts. Alternatively, when/if a self-aligned contact gate is formed, the divots can subsequently be filled with nitride gate cap material, and, thus, can increase the likelihood of device failure due to a contact open.

To minimize the formation of such divots the gate cut trench could be formed in a sacrificial gate structure, thereby dividing the sacrificial gate structure into two discrete sacrificial gate sections, and the gate cut trench can be filled with a dielectric material, thereby forming the dielectric column. Subsequently, the sacrificial gate sections can be selectively removed. RMGs can then be formed in openings on either side of the dielectric column. However, as designs are developed that include even smaller devices and an even greater device density, it has become increasing more difficult to form RMGs in relatively small openings without the occurrence of defects that can impact device performance.

Specifically, to form RMGs with different work functions for different FINFETs (e.g., a P-type FINFET and an N-type FINFET) in a pair of openings on either side of a dielectric column, a conformal high-K gate dielectric layer can be deposited to line both openings. An anneal process can be performed to improve the reliability of the high-K gate dielectric layer. For example, a conformal sacrificial titanium nitride layer can be deposited on the high-K gate dielectric layer and a sacrificial amorphous silicon layer can be deposited onto the sacrificial titanium nitride layer. A reliability anneal can then be performed in order to modify the molecular structure of the high-K gate dielectric layer so as to improve its reliability (e.g., to minimize gate leakage, negative bias temperature instability, etc.). Following the reliability anneal, cleaning processes can be performed to completely remove the sacrificial amorphous silicon and titanium nitride layers. Subsequently, different stacks of gate conductor materials can be formed in the two openings to achieve different work functions. However, when openings are relatively small and separated by a dielectric column as described above, the space between the dielectric column and an adjacent semiconductor fin may be relatively narrow (particularly in the event of overlay errors). In this case, the sacrificial amorphous silicon layer deposited prior to the reliability anneal may pinch-off during deposition before completely filling the space between the dielectric column and the adjacent semiconductor fin, thereby creating a void. If such a void is created, an oxide coating can form on surfaces within the void during the reliability anneal. This oxide coating effectively protects the amorphous silicon layer during subsequent cleaning processes such that a nitride-Si and underneath TiN residue may remain on the surface of the high-K gate dielectric layer in the resulting RMG. This residue can cause leakage issues, threshold voltage variation, etc.

In view of the foregoing, disclosed herein are embodiments of a method of forming an integrated circuit (IC) structure with at least one first-type FINFET (e.g., a P-type FINFET) and at least one second-type FINFET (e.g., an N-type FINFET), wherein the first-type FINFET has a first replacement metal gate (RMG) adjacent to at least one first semiconductor fin, wherein the second-type FINFET has a second RMG adjacent to at least one second semiconductor fin, and wherein the first RMG is in end-to-end alignment with the second RMG and physically and electrically isolated from the second RMG by a dielectric column. The disclosed embodiments of the method minimize the risk of the occurrence defects within the RMGs, even with relatively small devices and a relatively high device density, by forming the dielectric column during formation of the first and second RMGs and, particularly, after deposition and anneal of a gate dielectric layer for the first and second RMGs, but before deposition of at least one of multiple work function metal layers. Also disclosed herein are embodiments of an IC structure formed according to the above-described method embodiments.

Figure 1B:
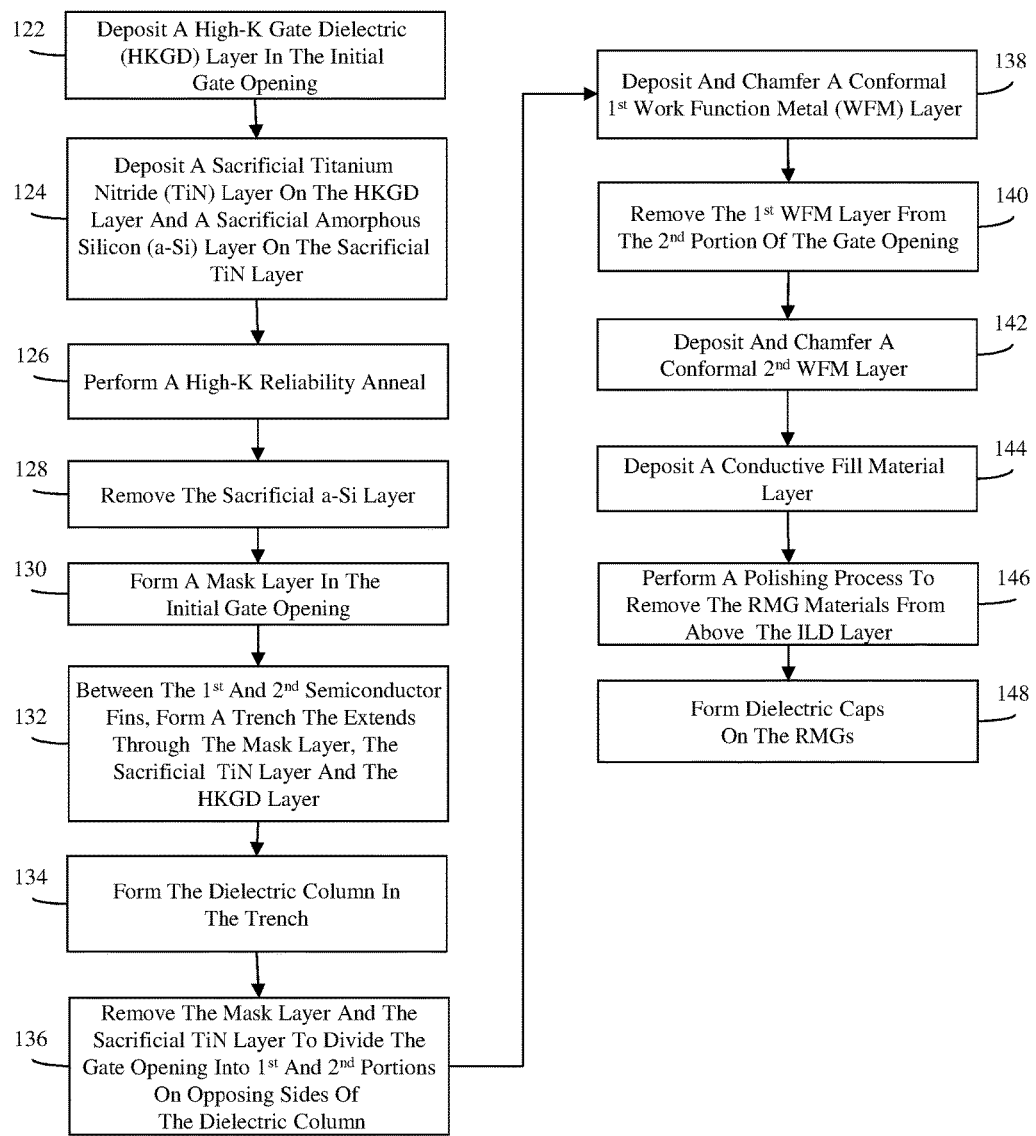
Figure 1C:
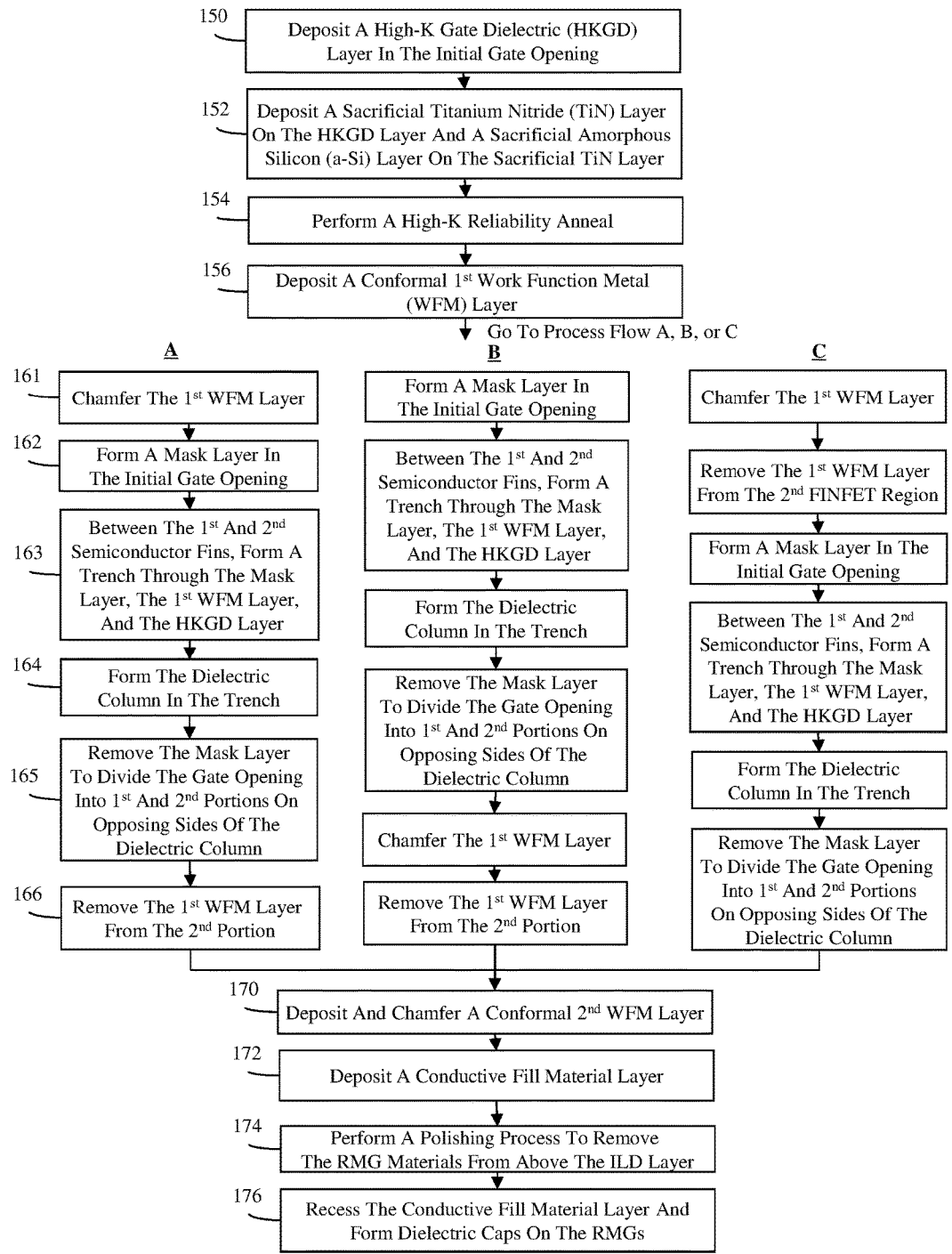
Figure 2A:
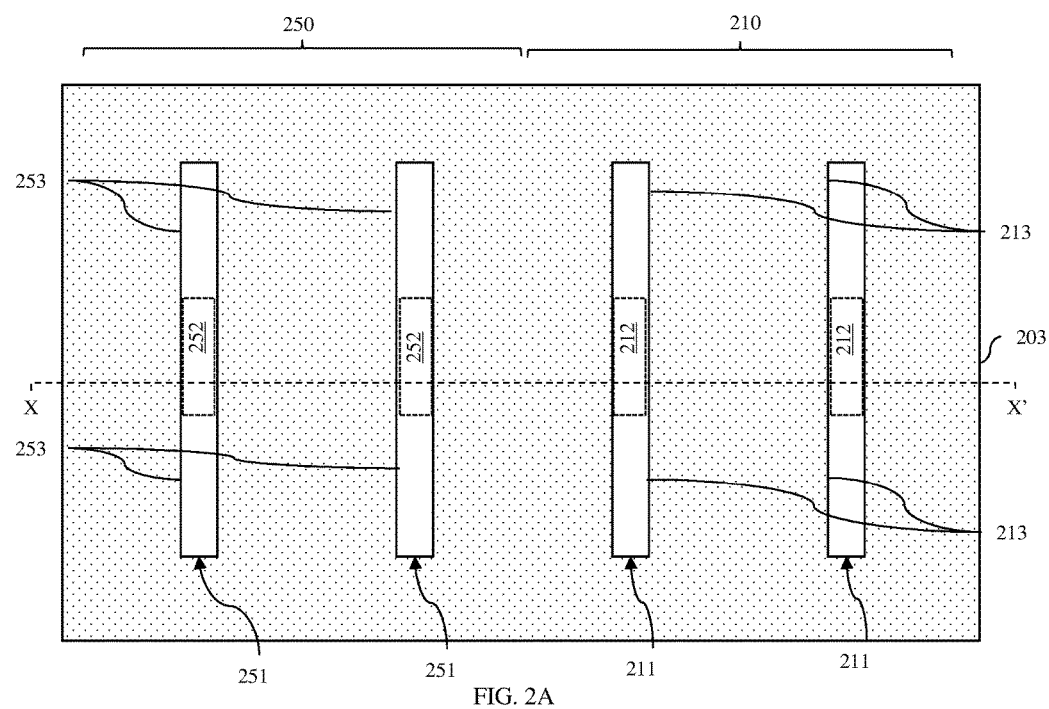
FIGS. 2A and 2B are top view and cross-section diagrams, respectively, illustrating a partially completed structure formed according to the method of FIGS. 1A-1C.
Figure 2B:
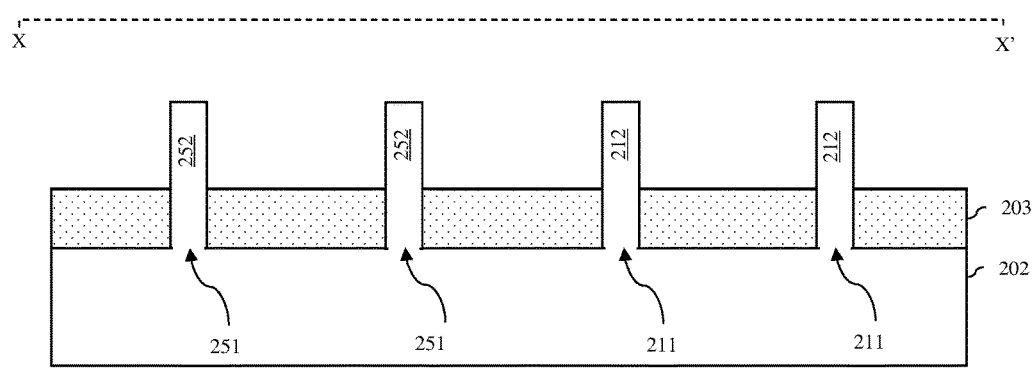

Referring to the flow diagram of FIGS. 1A-1C, the method includes providing a semiconductor wafer (102) and forming a plurality of essentially parallel semiconductor fins (i.e., elongated rectangular-shaped semiconductor bodies) for a plurality of fin-type field effect transistors (FINFETs) on the semiconductor wafer (104). The semiconductor wafer provided at process 102 can be, for example, a bulk semiconductor wafer (e.g., a bulk silicon wafer or other suitable bulk semiconductor wafer). Alternatively, a semiconductor-on-insulator wafer (e.g., a silicon-on-insulator (SOI) wafer) could be used. The parallel semiconductor fins can include one or more first semiconductor fins 211 for a first-type FINFET 210 (e.g., a P-type FINFET) in a first device region and one or more second semiconductor fins 251 for a second-type FINFET 250 (e.g., an N-type FINFET) in a second device region, as shown in FIGS. 2A-2B. For purposes of illustration, two first semiconductor fins and two second semiconductor fins are shown. However, it should be understood that the figures are not intended to be limiting and that one or more first semiconductor fins and one or more second semiconductor fins could, alternatively, be formed.

In any case, techniques for forming such semiconductor fins (e.g., lithographic patterning techniques, sidewall image transfer techniques, replacement fin techniques, etc.) are well known in the art and, thus, the details have been omitted from this specification in order to allow the reader to focus on the salient aspects of the disclosed method. However, by design, each semiconductor fin 211, 251 will have designated areas for source/drain regions 213, 253 and a channel region 212, 252 positioned laterally between the source/drain regions 213, 253. For example, the first semiconductor fin(s) 211 will have a first channel region 212 positioned laterally between first source/drain regions 213 and the second semiconductor fin(s) 251 will have a second channel region 252 positioned laterally between second source/drain regions 253. Optionally, each semiconductor fin 211, 251 can be doped, either before or after formation, so that its channel region has appropriate type conductivity at a relatively low conductivity level. For example, for a P-type FINFET, each channel region can have an N− conductivity; whereas, for an N-type FINFET, each channel region can have a P− conductivity.

It should be noted that, if the semiconductor wafer on which the semiconductor fins 211, 251 are formed at process 104 is a bulk semiconductor wafer, an isolation region 203 can be further formed around the lower portion of each semiconductor fin and can extend laterally between adjacent semiconductor fins. For example, a silicon oxide layer can be deposited over the semiconductor fins 211, 251 and recessed to form an isolation region 203. If, however, the semiconductor wafer on which the semiconductor fins 211, 251 are formed at process 104 is an SOI wafer, the semiconductor fins 211, 251 can extend essentially vertically upward from the top surface of an insulator layer such that portions of the insulator layer function as an isolation region extending laterally between adjacent semiconductor fins.

Figure 3A:
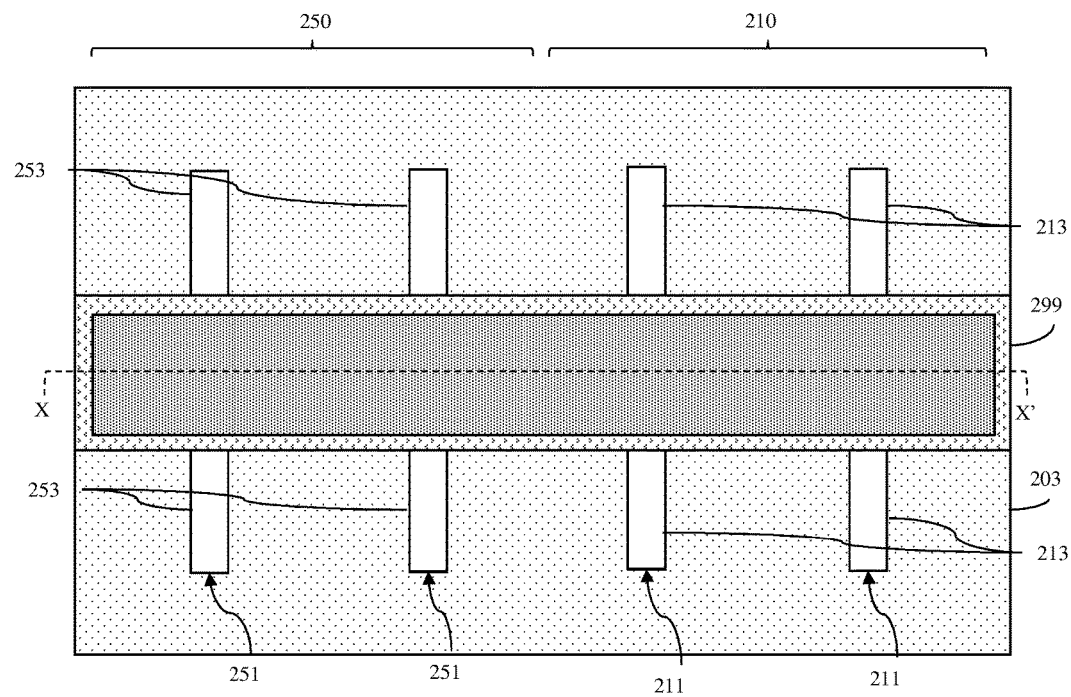
FIGS. 3A and 3B are top view and cross-section diagrams, respectively, illustrating a partially completed structure formed according to the method of FIGS. 1A-1C.
Figure 3B:
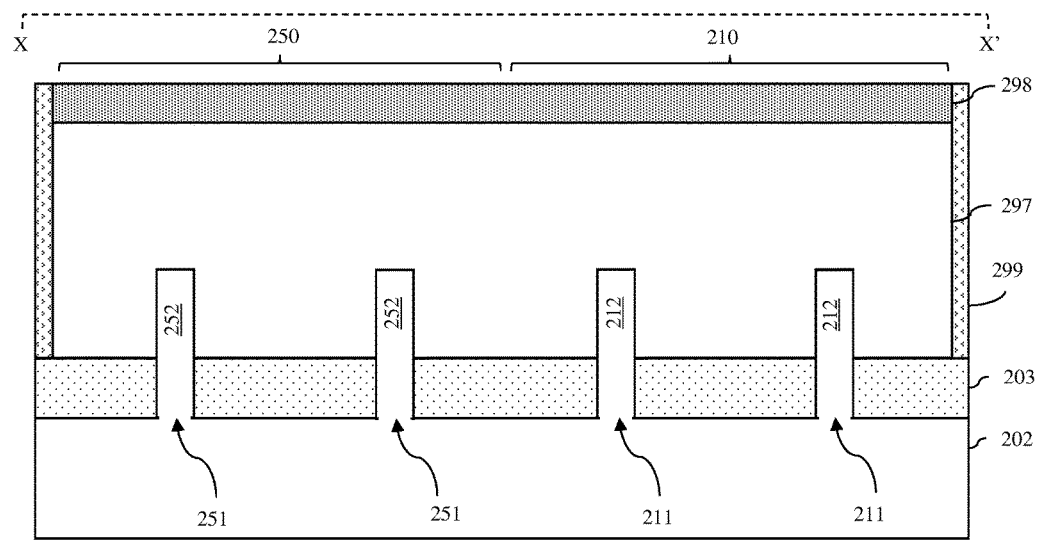

Next, a sacrificial gate 297 (also referred to as a dummy gate) with a sacrificial gate cap 298 and a dielectric gate sidewall spacer 299 can be formed adjacent to each semiconductor fin 211, 251 (106, see FIGS. 3A-3B). Specifically, a sacrificial gate 297 can be formed such that it is on a first top surface and first opposing sides of each first semiconductor fin 211 at the first channel region 212 and such that it is on a second top surface and second opposing sides of the each second semiconductor fin 251 at the second channel region 252. To form such a sacrificial gate 297, a blanket first sacrificial layer (e.g., a thin gate oxide, followed by a sacrificial polysilicon layer, a sacrificial amorphous silicon layer or other suitable sacrificial layer) can be formed above and adjacent to the opposing sides of each semiconductor fin 211, 251. A polishing process (e.g., a chemical mechanical polishing (CMP) process) can be performed to ensure that the top surface of the first sacrificial layer is essentially planar. Then, a second sacrificial layer (e.g., a sacrificial nitride layer, a silicon boron carbon nitride layer or other suitable dielectric layer), which is different from the first sacrificial layer, can be formed on the top surface of the first sacrificial layer. The first and second sacrificial layers can then be lithographically patterned and etched to form the sacrificial gate 297 with a sacrificial gate cap 298.

A dielectric gate sidewall spacer 299 can then be formed on the sidewalls of the sacrificial gate 297 such that it laterally surrounds and is immediately adjacent to the sacrificial gate 297. The dielectric gate sidewall spacer 299 can be formed, for example, using conventional sidewall spacer formation techniques. Such sidewall spacer formation techniques are well known in the art and, thus, the details of those techniques have been omitted from the specification in order to allow the reader to focus on the salient aspects of the disclosed method. In any case, the dielectric gate sidewall spacer 299 can be made of silicon nitride, silicon carbon nitride, silicon boron carbon nitride, silicon oxycarbide, or any other suitable gate sidewall spacer material that is different from the material used for the sacrificial gate 297.

Source/drain regions 213, 253 for the different FINFETs 210, 250 can be formed in the semiconductor fins 211, 251 on opposing sides of the channel regions 212, 252 (108). For example, a masked dopant implantation process can be performed to dope the first source/drain regions of the first-type FINFET 210 with a first dopant so that they have a first-type conductivity at a relatively high conductivity level (e.g., P+ conductivity for a P-type FINFET). Another masked dopant implantation process can be performed to dope the second source/drain regions 253 of the second-type FINFET 250 with a second dopant so that they have a second-type conductivity at a relatively high conductivity level (e.g., N+ conductivity for an N-type FINFET). Additionally or alternatively, epitaxial semiconductor material (e.g., epitaxial silicon or any other suitable epitaxial semiconductor material) can be deposited on exposed portions of each semiconductor fin to form epitaxial source/drain regions (not shown). The epitaxial semiconductor material can be in-situ doped or subsequently implanted. Optionally, the source/drain regions of each semiconductor fin can be recessed prior to deposition of epitaxial semiconductor material (not shown).

Figure 4A:
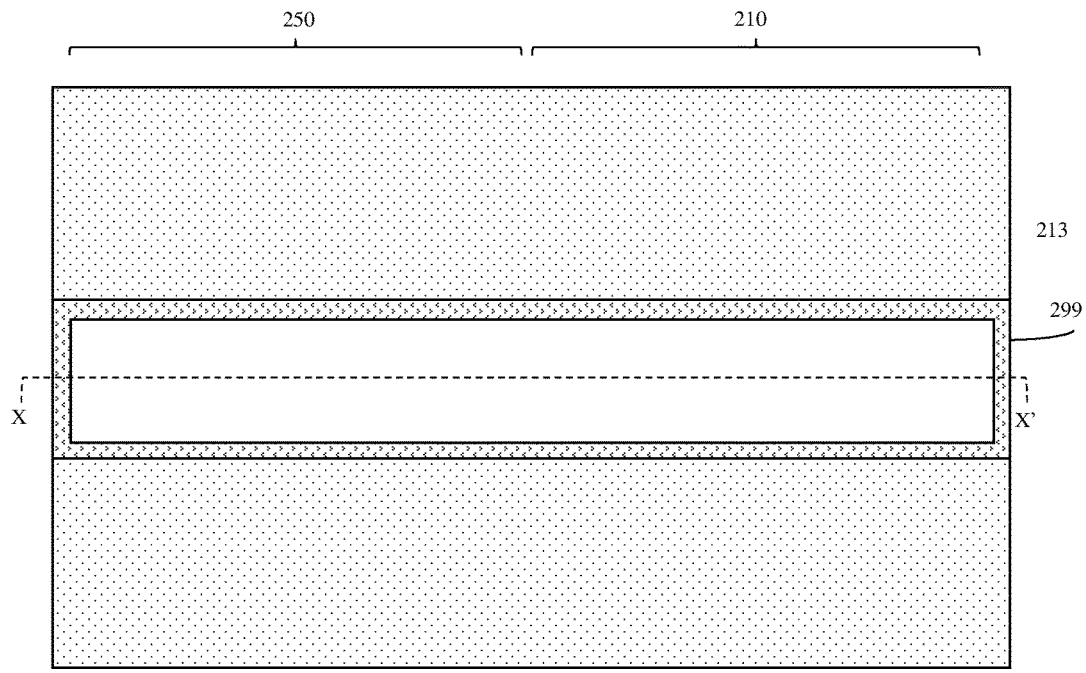
FIGS. 4A and 4B are top view and cross-section diagrams, respectively, illustrating a partially completed structure formed according to the method of FIGS. 1A-1C.
Figure 4B:
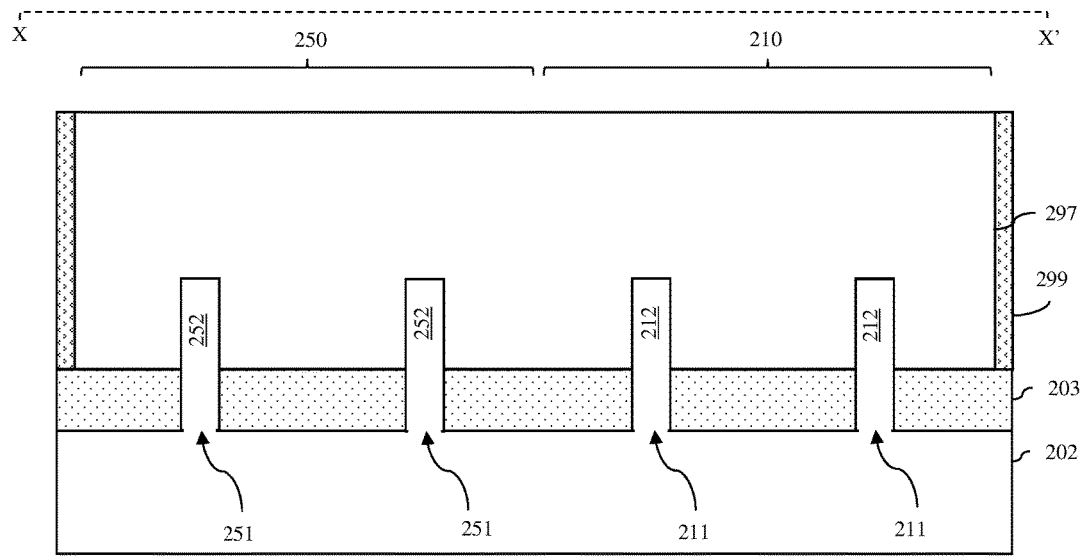

Subsequently, a blanket interlayer dielectric (ILD) layer 296 can be deposited over the partially completed structures (110, see FIGS. 4A-4B). The ILD layer 296 can be, for example, a silicon oxide layer or a layer of some other suitable ILD material (e.g., borophosphosilicate glass (BPSG), tetraethyl orthosilicate (TEOS), fluorinated tetraethyl orthosilicate (FTEOS), etc.). A polishing process (e.g., a CMP process) can then be performed to expose the top surface of the surface of the sacrificial gate 297.

Figure 5A:
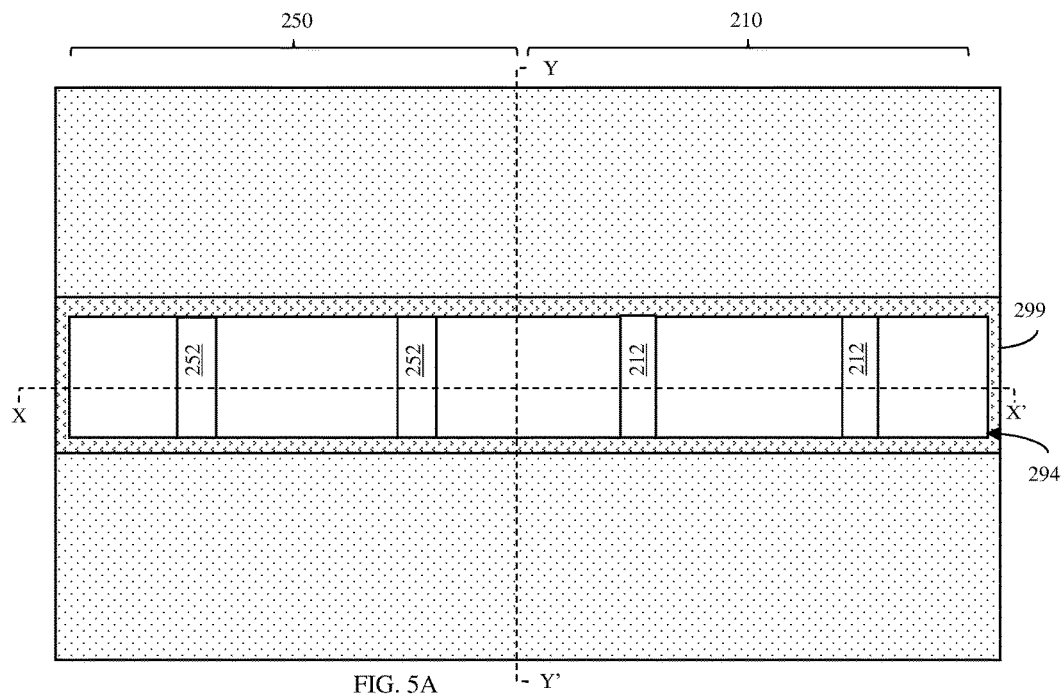
FIG. 5A is a top view diagram and FIGS. 5B and 5C are different cross-section diagrams illustrating a partially completed structure formed according to the method of FIGS. 1A-1C.
Figure 5B:
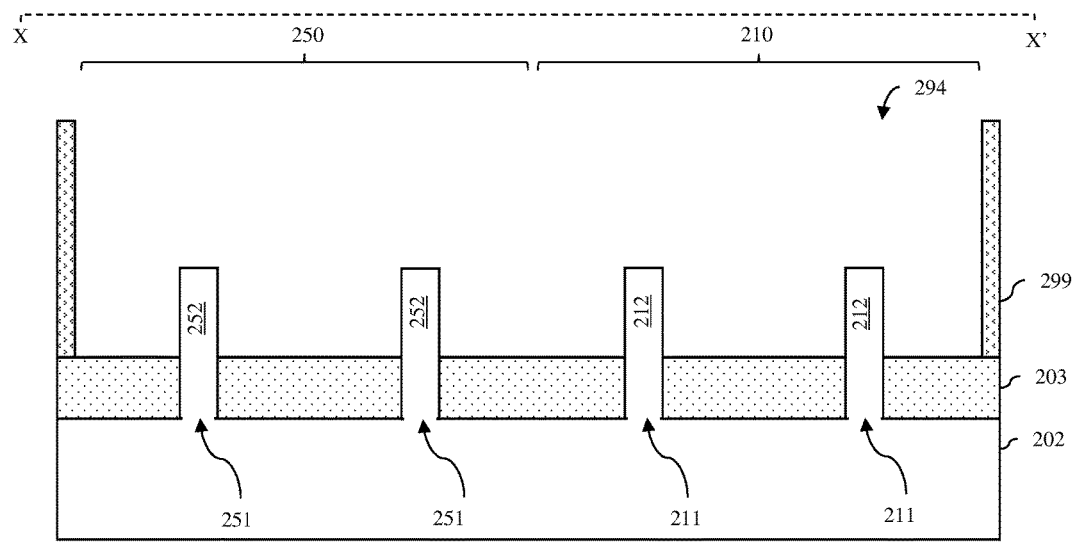
Figure 5C:
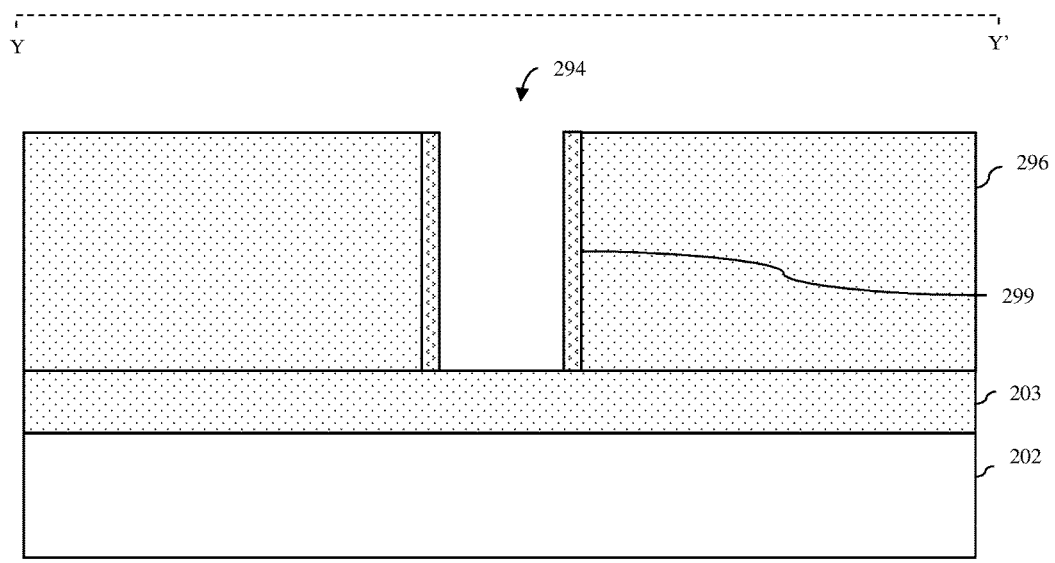

The sacrificial gate 297 can be selectively removed (e.g., using a selective etch process) to create a gate opening 294 that exposes the first channel region 212 of each first semiconductor fin 211 as well as the second channel region 252 of each second semiconductor fin 251 (112, see FIGS. 5A-5C). It should be noted that the selective etch process should be selective for the material of the sacrificial gate 297 over the materials of the semiconductor fins 211, 251, the ILD layer 296, the dielectric gate sidewall spacer 299 and the isolation region 203.

Then, in the gate opening 294, a first replacement metal gate (RMG) can be formed adjacent to the exposed first channel region 212 of each first semiconductor fin 211, a second RMG can be formed adjacent to the exposed second channel region 252 of each second semiconductor fin 251 and a dielectric column can be formed between the first RMG and the second RMG such that within the gate opening 294 the first RMG is physically separated and electrically isolated from the second RMG (114). In each of the embodiments of the disclosed method, the dielectric column can specifically be formed during formation of the first RMG and the second RMG (i.e., while the first RMG and the second RMG are also being formed). More particularly, the dielectric column can be formed after deposition and anneal of a high-K gate dielectric layer for the first RMG and the second RMG, but before deposition of at least one of multiple work function metal layers.

For example, in a first embodiment of the method, the dielectric column is formed after deposition and anneal of a high-K gate dielectric layer for the first RMG and the second RMG, but before deposition of any work function metal layers (116, see FIG. 1B and the detailed description below). In second embodiment of the method, the dielectric column is formed after deposition and anneal of a high-K gate dielectric layer for the first RMG and the second RMG and after deposition of a first work function metal layer on the gate dielectric layer, but before deposition of a second work function metal layer (118, see FIG. 1C and the detailed description below).

Figure 6A:
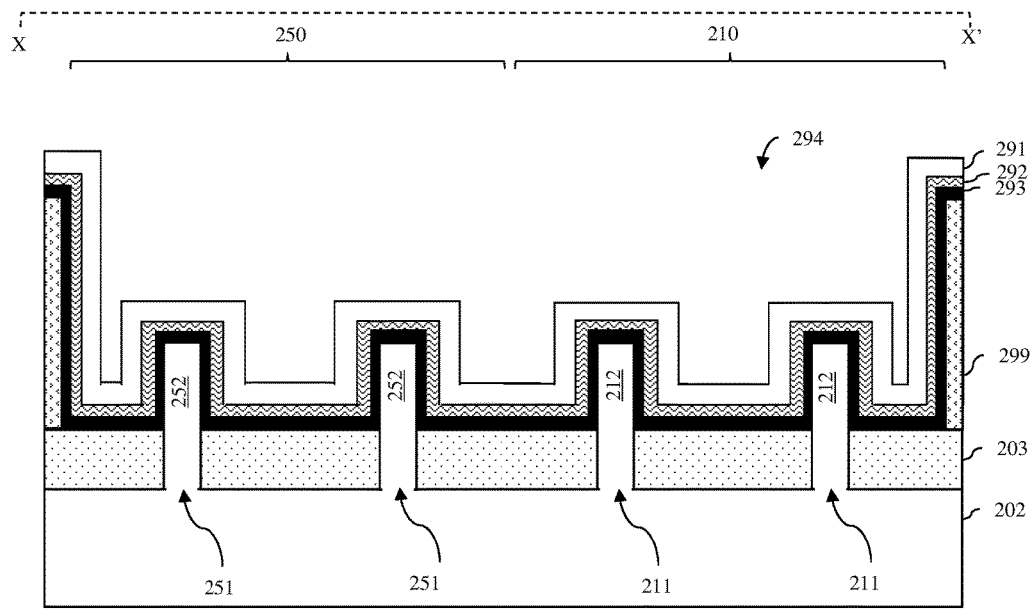
FIGS. 6A and 6B are different cross-section diagrams illustrating a partially completed structure formed according to the method of FIGS. 1A-1C.
Figure 6B:
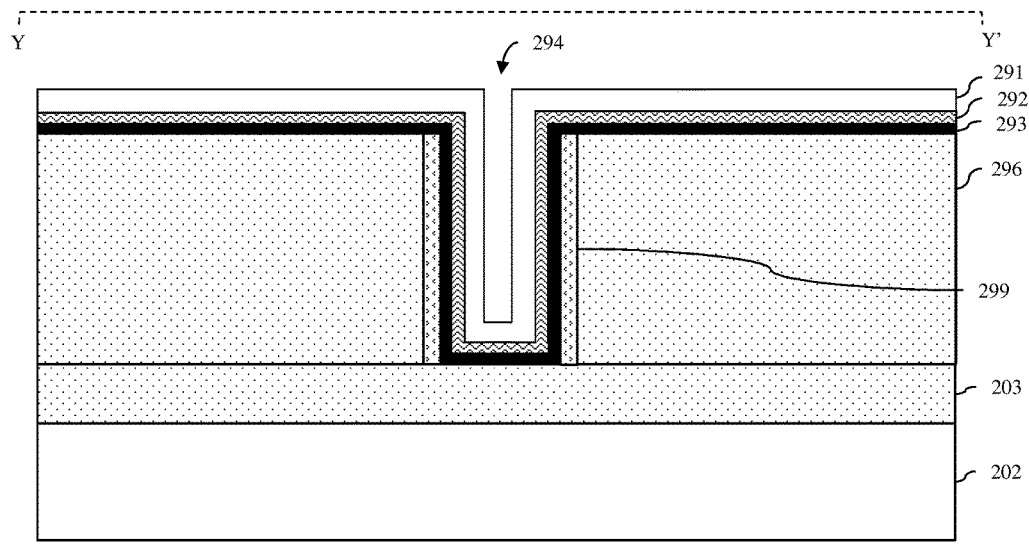
Figure 7A:
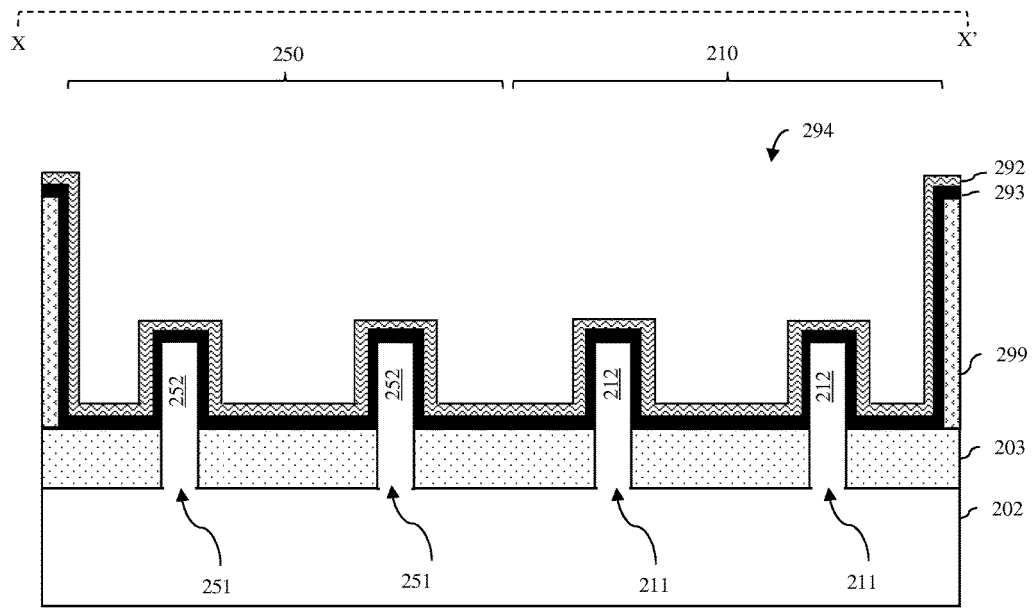
FIGS. 7A and 7B are different cross-section diagrams illustrating a partially completed structure formed according to a first embodiment of the method as shown in FIG. 1B.
Figure 7B:
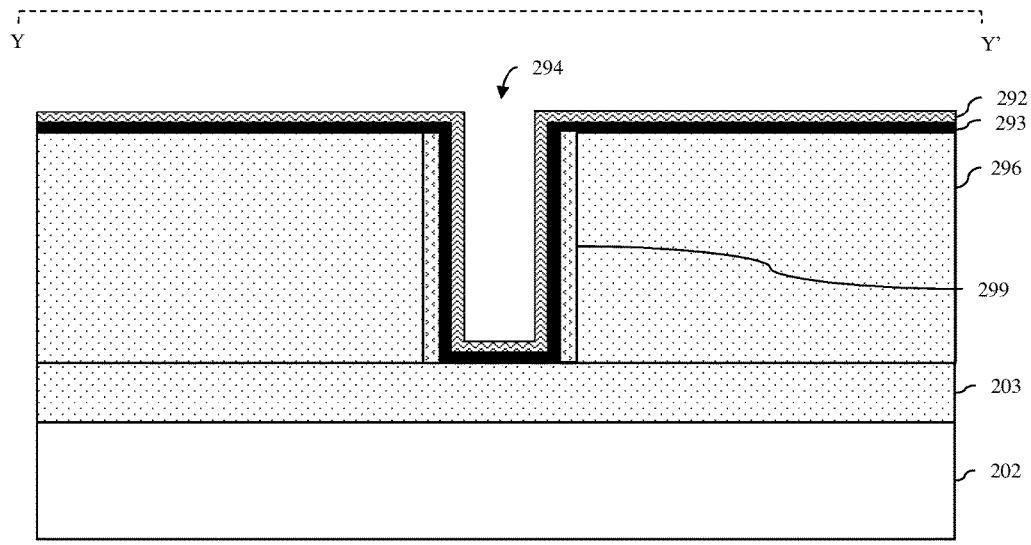

More specifically, referring to FIG. 1B, in a first embodiment of the method, a gate dielectric layer and, particularly, a high-K gate dielectric layer 293 can be conformally deposited in the gate opening 294 (122). An anneal process can subsequently be performed to improve the reliability of the high-K gate dielectric layer 293. For example, a conformal sacrificial titanium nitride layer 292 can be deposited on the high-K gate dielectric layer 293 and a sacrificial amorphous silicon layer 291 can be deposited onto the sacrificial titanium nitride layer 292 (124). In one exemplary embodiment, the fin pitch can be approximately 15-25 nm (e.g., 20 nm), the thickness of the high-K gate dielectric layer 293 can be approximately 1-2 nm (e.g., 1.5 nm), the thickness of the sacrificial titanium nitride layer 292 can be approximately 1-2 nm (e.g., 1.5 nm) and the thickness of the sacrificial amorphous silicon layer 291 can be approximate 3-5 nm (e.g., 4 nm). The partially completed structure can then be subjected to an anneal (e.g., a laser anneal up to 1000° C.) in order to modify the molecular structure of the high-K gate dielectric layer so as to improve its reliability (e.g., to minimize gate leakage, negative bias temperature instability, etc.) (126, see FIGS. 6A-6B).

Figure 8A:
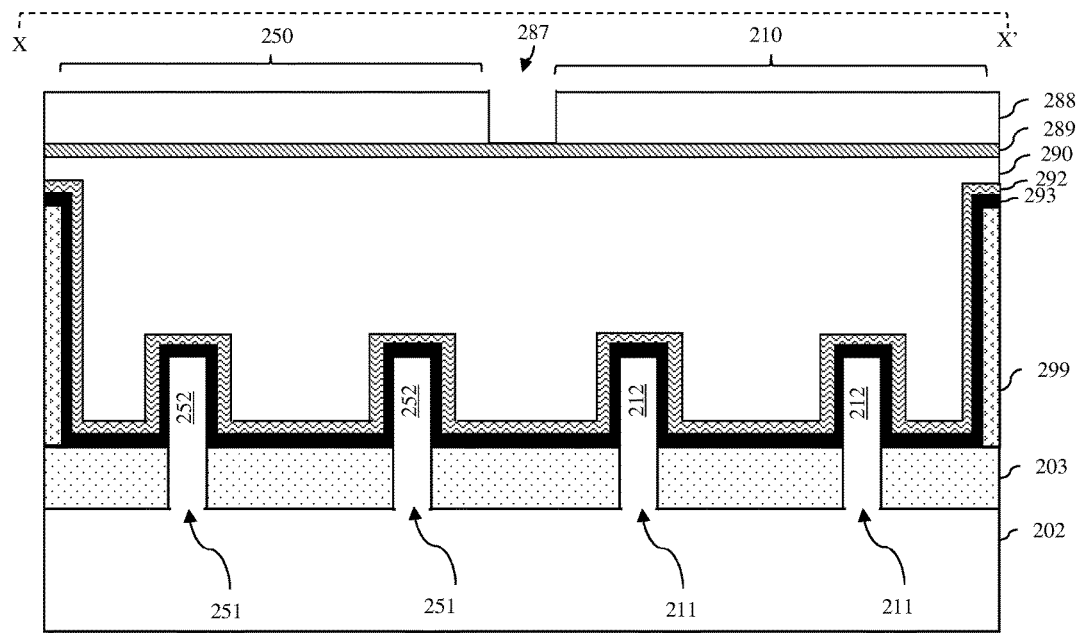
FIGS. 8A and 8B are different cross-section diagrams illustrating a partially completed structure formed according to the first embodiment of the method as shown in FIG. 1B.
Figure 8B:
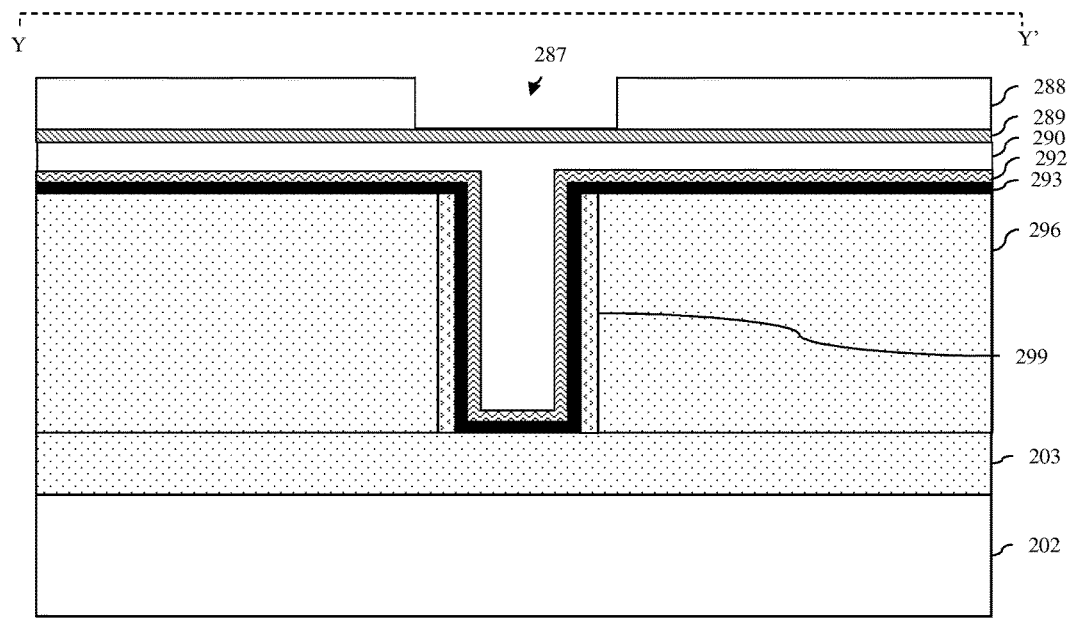
Figure 9A:
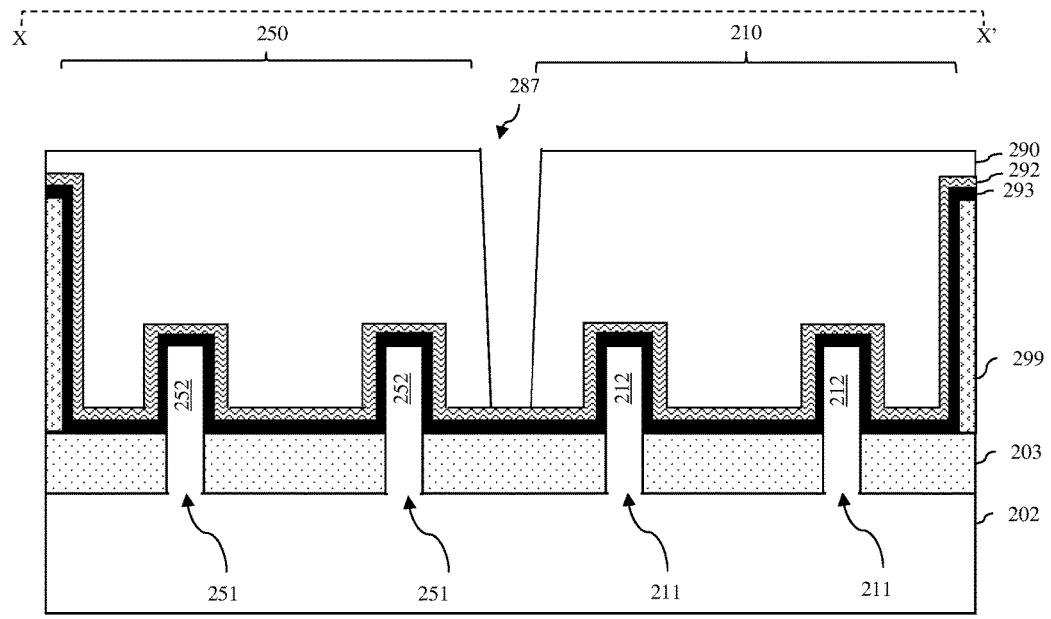
FIGS. 9A and 9B are different cross-section diagrams illustrating a partially completed structure formed according to the first embodiment of the method as shown in FIG. 1B.
Figure 9B:
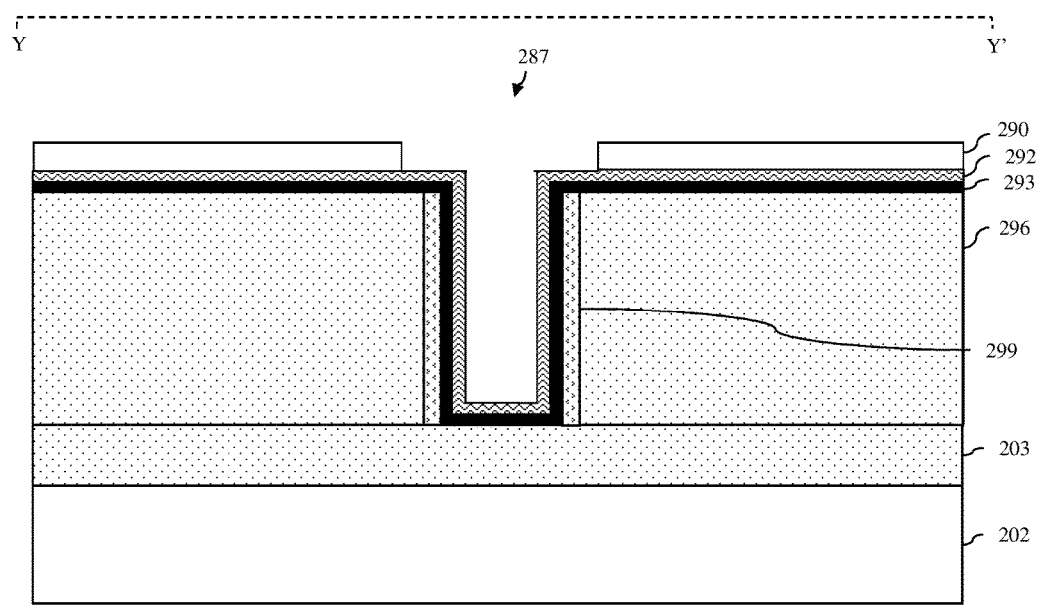
Figure 10A:
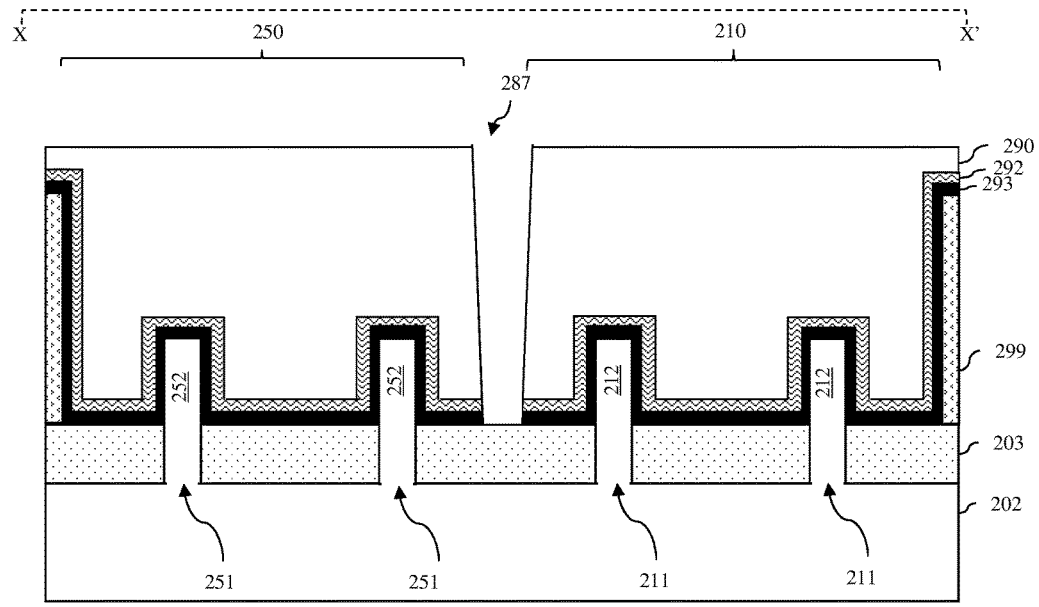
FIGS. 10A and 10B are different cross-section diagrams illustrating a partially completed structure formed according to the first embodiment of the method as shown in FIG. 1B.
Figure 10B:
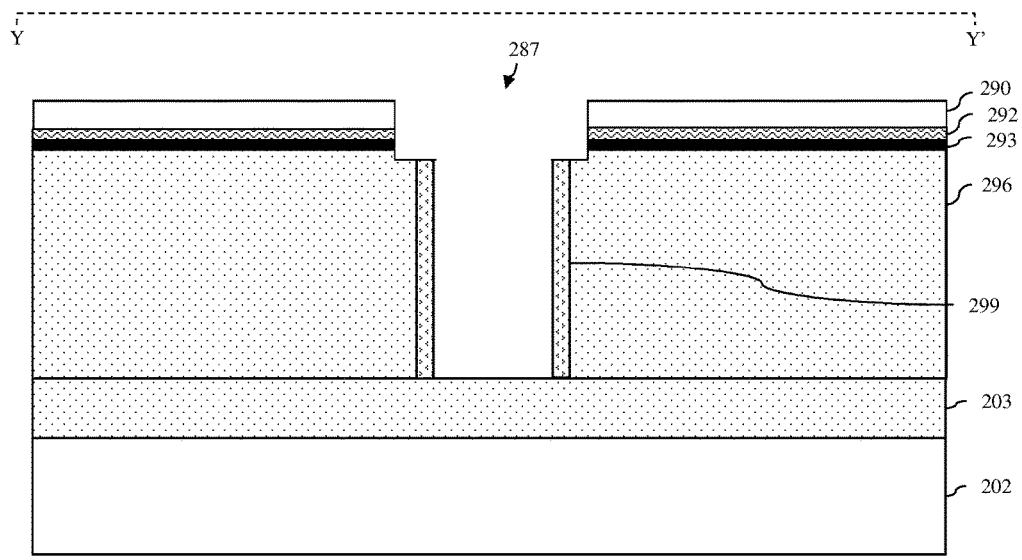

After the anneal process is performed, the sacrificial amorphous silicon layer 291 and, optionally, the sacrificial titanium nitride layer 292 can be removed (128). Then, a mask layer 290 can be formed in the gate opening (130) and a trench (referred to herein as a gate cut trench) can be formed in the mask layer 290, as described in greater detail below (132). For example, a mask layer 290 (e.g., an optical planarization layer (OPL)) can be deposited (e.g., using a spin-on process) so as to fill the gate opening and cover the top surface of the ILD layer 296. The mask layer 290 can be polished (e.g., using a CMP process). Optionally, the mask layer 290 can further be etched back and additional OPL material can be re-deposited to improve uniformity. Then, an anti-reflective coating (ARC) 289 can be formed on the top surface of the mask layer 290 and a photoresist layer 288 can be formed on the ARC 289. The photoresist layer 288 can be patterned with a shape. This shape can be positioned above the isolation region 203 between the first semiconductor fin(s) 211 and the second semiconductor fin(s) 251 and can extend across the full width of the gate opening so as to overlap the dielectric gate sidewall spacer 299 (see FIGS. 8A-8B). An anisotropic etch process can then be performed to transfer an image of the shape through the ARC 289 and an additional anisotropic etch process can be performed to transfer the image of the shape into and through the mask layer 290 to the sacrificial titanium nitride layer 292, if still present, as illustrated (or to the high-K gate dielectric layer 293, if the sacrificial titanium nitride layer 292 has already been removed). It should be noted that, if the photoresist layer and the mask layer are organic materials, the anisotropic etch process used to transfer the image of the shape through the mask layer will also remove the photoresist layer. Then, any remaining material above the mask layer 290 and, specifically, the ARC 289 can be removed (see FIGS. 9A-9B). Next, at least one isotropic etch process can be performed to removed exposed vertical and horizontal portions of the sacrificial titanium nitride layer 292 (if present) and the high-K gate dielectric layer 293 (see FIGS. 10A-10B). Thus, the resulting trench 287 extends essentially vertically through the mask layer 290 to the isolation region 203 and is essentially parallel to and positioned laterally between the first semiconductor fin(s) 211 and the second semiconductor fin(s) 251. In a first direction, as shown in FIG. 10A, opposing sidewalls of the trench 287 are defined by essentially vertical surfaces of the mask layer 290 and in a second direction, as shown in FIG. 10B, opposing sidewalls of the trench 287 are defined by essentially vertical surfaces of the gate sidewall spacer 299. It should be noted that the etch processes used to form the trench 287 may result in divots in the top surface of the ILD layer 296; however, these divots are relatively small as compared to the divots that are developed using prior art techniques.

Figure 11A:
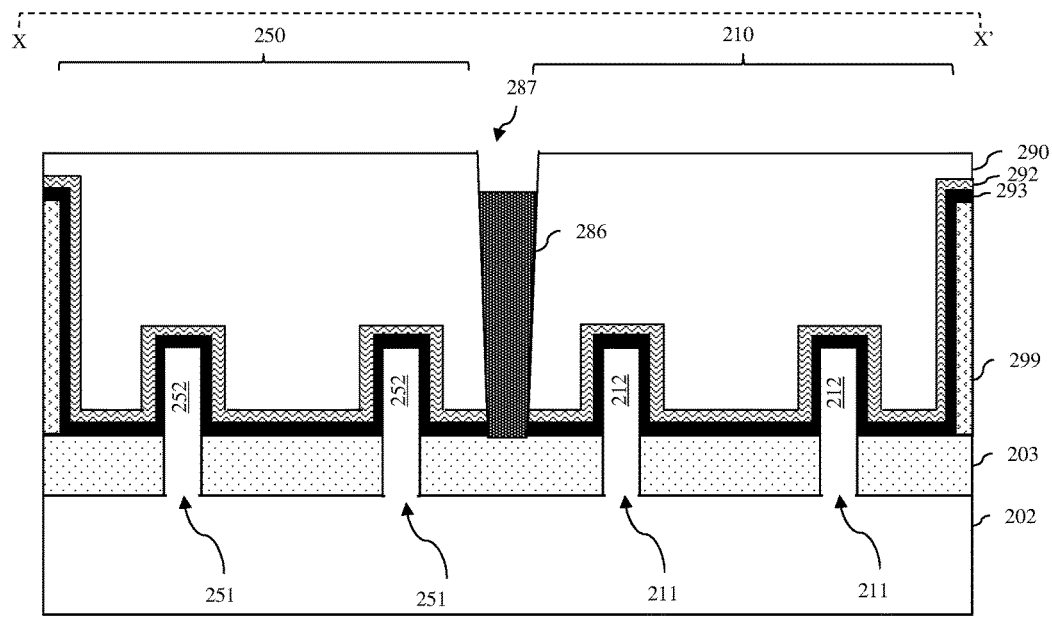
FIGS. 11A and 11B are different cross-section diagrams illustrating a partially completed structure formed according to the first embodiment of the method as shown in FIG. 1B.
Figure 11B:
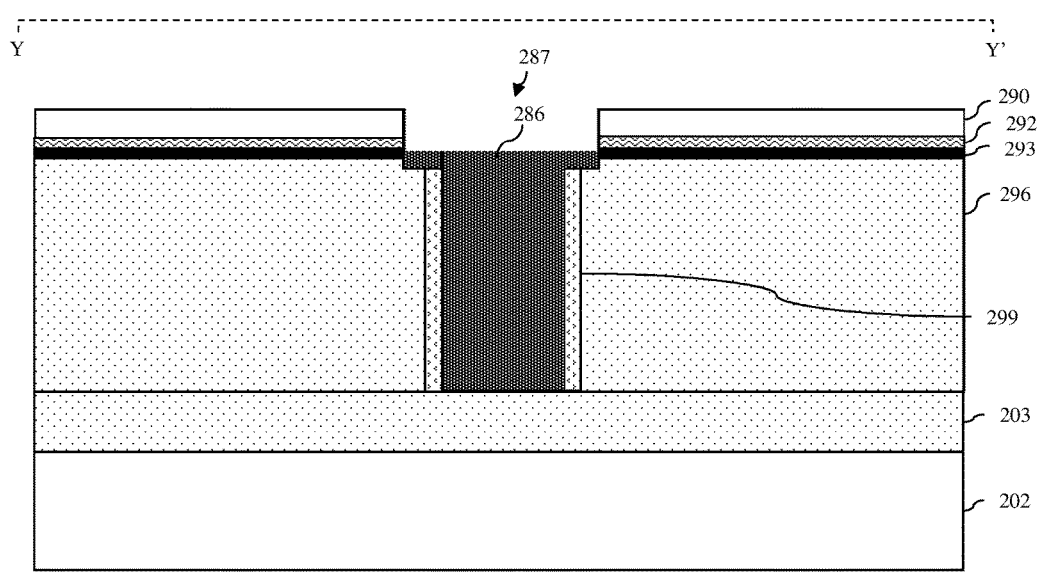
Figure 12A:
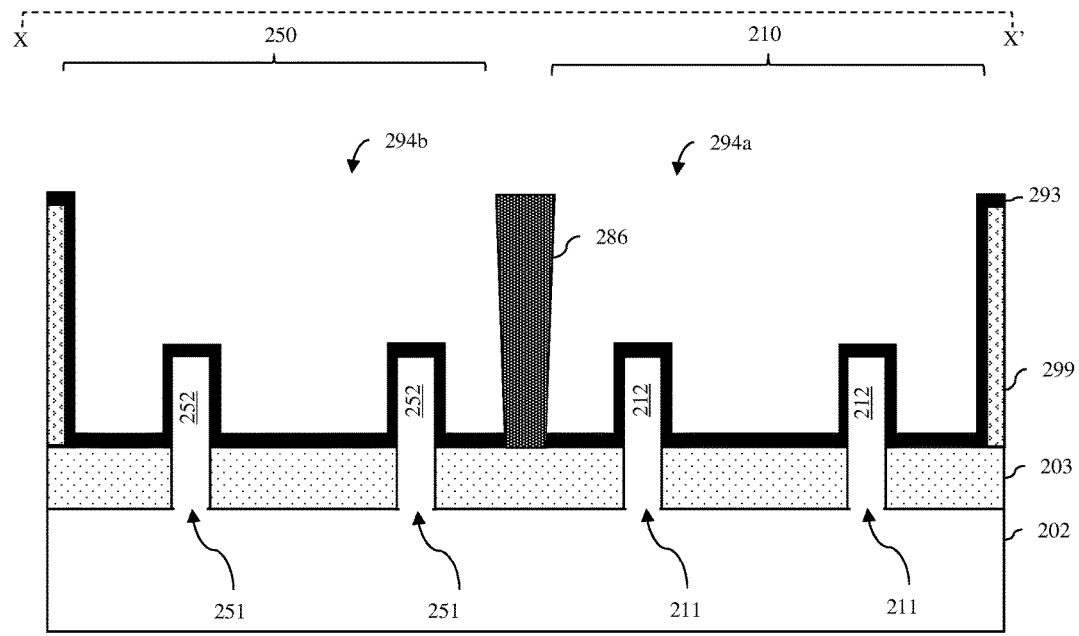
FIGS. 12A and 12B are different cross-section diagrams illustrating a partially completed structure formed according to the first embodiment of the method as shown in FIG. 1B.
Figure 12B:
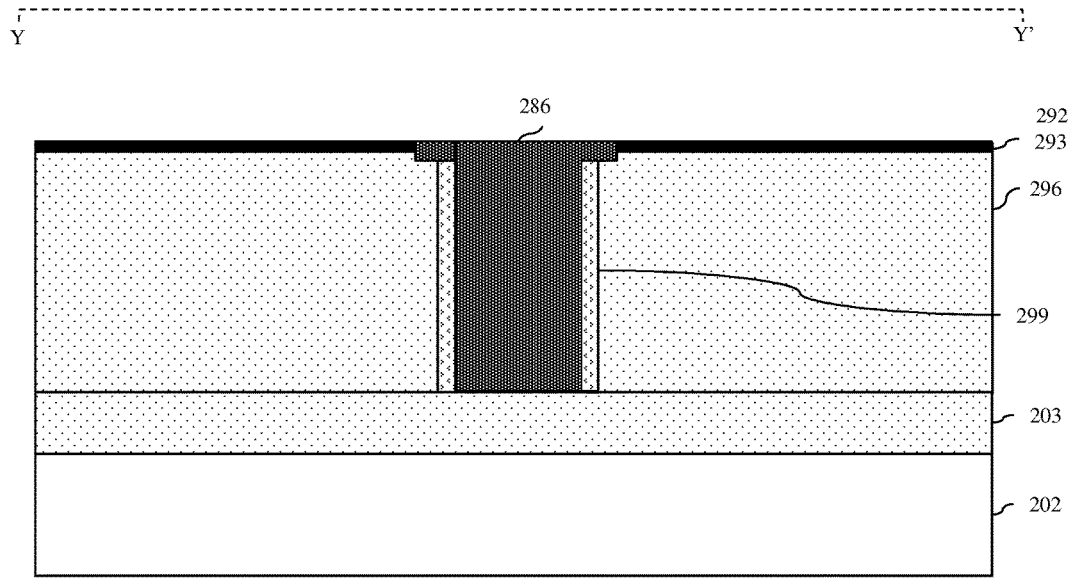

After the trench 287 is formed, a dielectric column 286 can be formed within the trench 287 (134, see FIGS. 11A-11B). To form the dielectric column 286, at least one layer of dielectric fill material can be deposited so as to fill the trench 287. In one embodiment, the dielectric fill material can be, for example, a single layer of silicon nitride, as illustrated. Alternatively, the dielectric fill material can be one or more layers of any other suitable dielectric material (e.g., silicon oxide, silicon oxynitride, etc.) (not shown). For example, in other embodiments, the dielectric fill material can include a conformal silicon nitride layer that lines the trench 287 and a silicon oxide layer, an undoped amorphous silicon layer, or any other suitable layer on the conformal silicon nitride layer. Next, the dielectric fill material can be removed from above the mask layer 290 (e.g., using polishing process, such as a CMP process, or an etch back process) and the remaining portion of the dielectric fill material can be recessed within the trench 287 to adjust a height of the resulting dielectric column 286 so that the top surface of the dielectric column 286 is at or above the level of the top surface of the ILD layer 296. The mask layer 290 (e.g., the OPL) can then be selectively removed in order to divide the gate opening 294 into a first portion 294a and a second portion 294b on opposing sides of the dielectric column 286 (136, see FIGS. 12A-12B).

Figure 13:
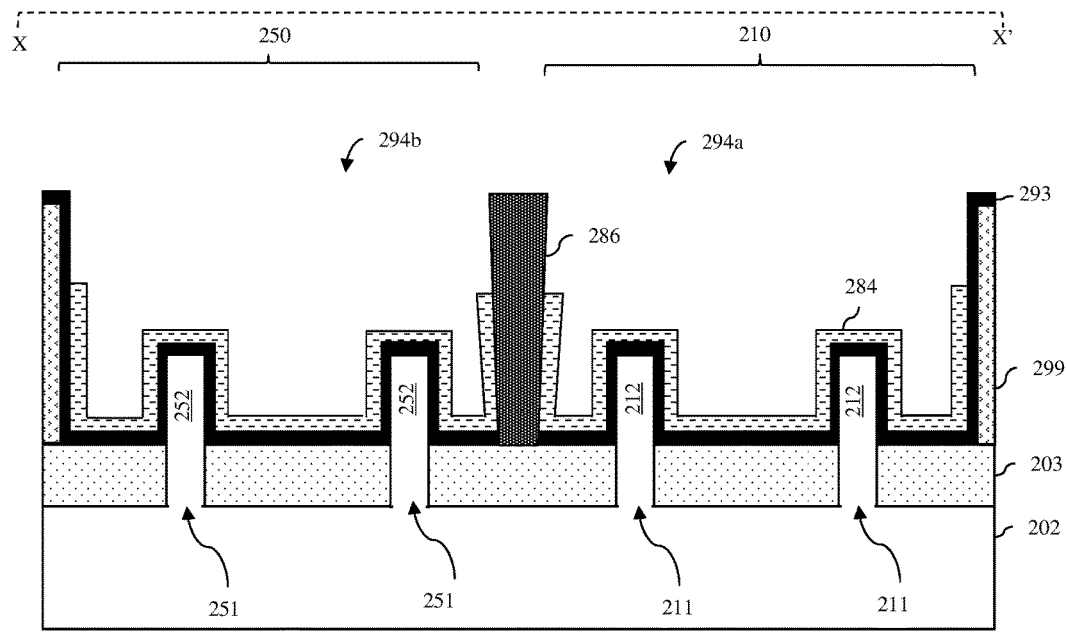
FIG. 13 is a cross-section diagram illustrating a partially completed structure formed according to the first embodiment of the method as shown in FIG. 1B.

To complete the RMGs, a first work function metal layer 284 can be conformally deposited so as to line the two portions 294a-b of the gate opening and this first work function metal layer 284 can be chamfered (138, see FIG. 13). The metal material or metal alloy material of the conformal first work function metal layer 284 can be pre-selected in order to achieve the optimal gate conductor work function given the conductivity type of the first-type FIN-FET. The chamfering process can include: depositing a protective fill material onto the first work function metal layer in the two portions of the gate opening; recessing the protective fill material; etching away the exposed first work function metal material from above the protective fill material such that the maximum height of the first work function metal layer is below the level of the top surface of the ILD layer 296; and removing the protective fill material.

Figure 14:
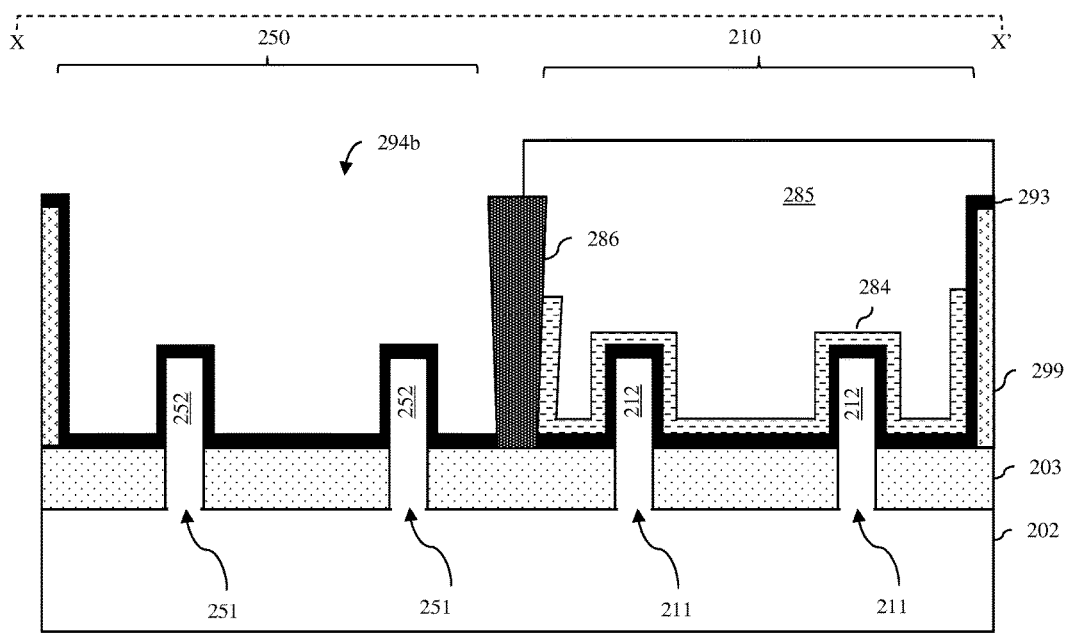
FIG. 14 is a cross-section diagram illustrating a partially completed structure formed according to the first embodiment of the method as shown in FIG. 1B.

A protective mask 285 can subsequently be formed over first device region and the first work function metal layer 284 can be removed (e.g., selectively etched away) from the second portion 294b of the gate opening (140, see FIG. 14). The protective mask 285 can then be removed.

Figure 15:
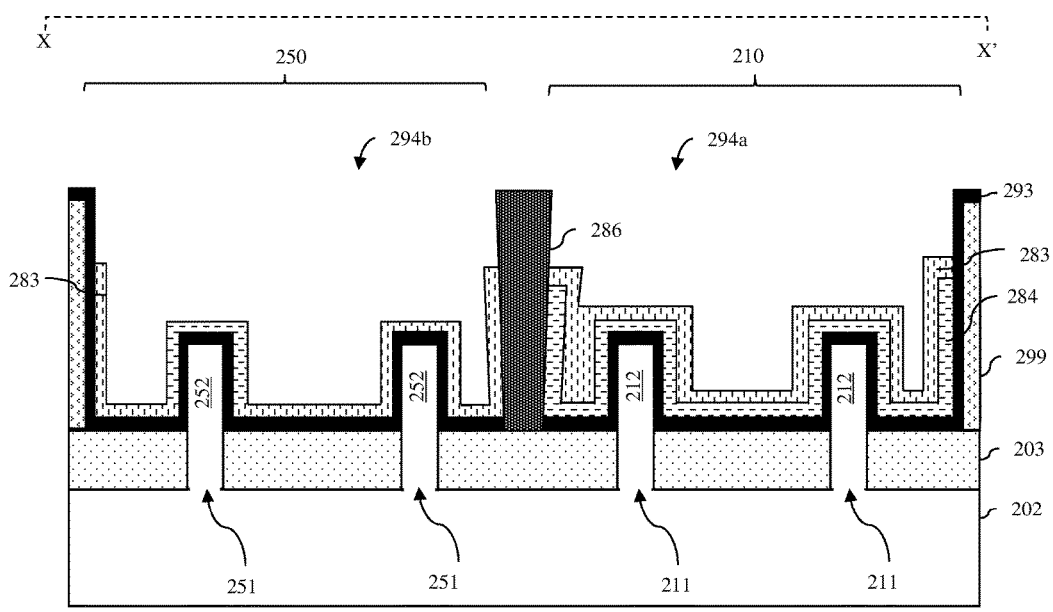
FIG. 15 is a cross-section diagram illustrating a partially completed structure formed according to one of the embodiments of the method as shown in FIG. 1B.

Next, a second work function metal layer 283 can be conformally deposited so as to line the two portions 294a-b of the gate opening and the second work function metal layer 283 can be chamfered (142, see FIG. 15). The metal material or metal alloy material of the conformal second work function metal layer 283 can be preselected in order to achieve the optimal gate conductor work function given the conductivity type of the second-type FINFET. The chamfering process can include: depositing a protective fill material onto the second work function metal layer in the two portions of the gate opening; recessing the protective fill material; etching away the exposed second work function metal material from above the protective fill material such that the maximum height of the second work function metal layer is below the level of the top surface of the ILD layer 296; and removing the protective fill material.

Figure 16:
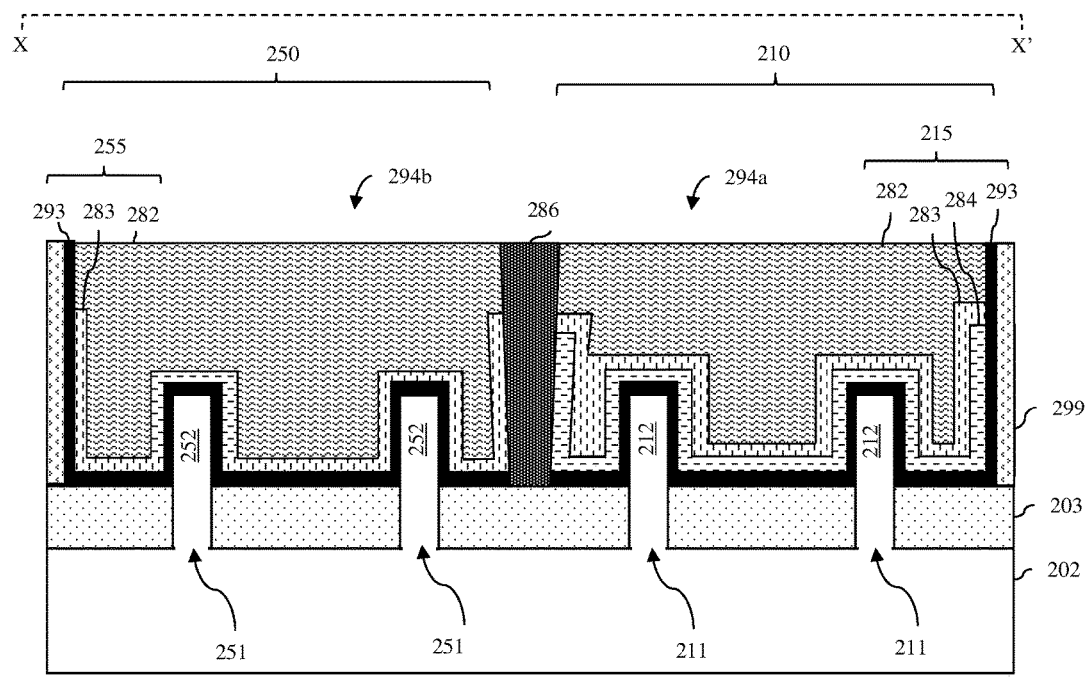
FIG. 16 is a cross-section diagram illustrating a partially completed structure formed according to the first embodiment of the method as shown in FIG. 1B.

A conductive fill material layer 282 can be deposited to fill any remaining space in the two portions 294a-b of the gate opening (144) and a polishing process (e.g., a CMP process) can be performed to remove any RMG materials from above the top surface of the ILD layer 296 (146, see FIG. 16).

Figure 17A:
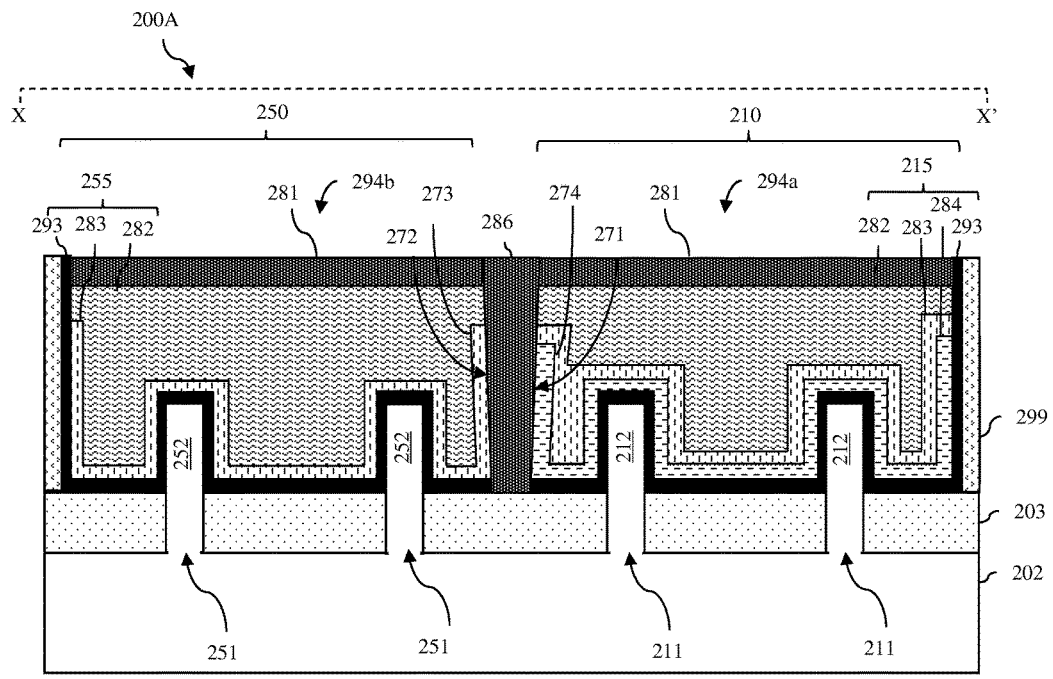
FIGS. 17A and 17B are different cross-section diagrams illustrating a structure 200A formed according to the first embodiment of the method as shown in FIG. 1B.
Figure 17B:
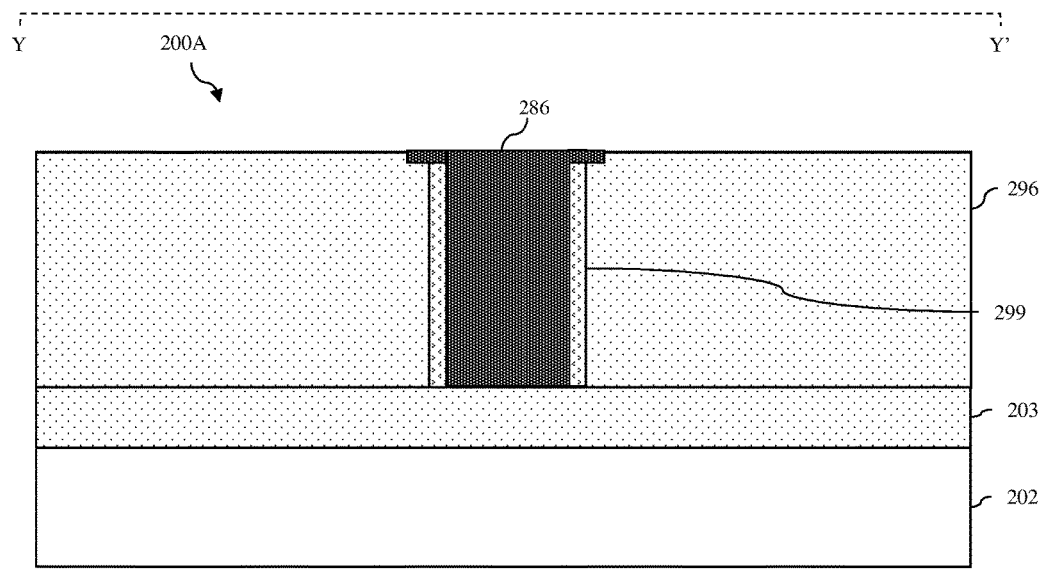

After the polishing process, dielectric gate caps 281 can be formed on the first RMG 215 in the first portion 294a of the gate opening and on the second RMG 255 in the second portion 294b of the gate opening (148, see FIGS. 17A-17B). For example, the conductive fill material layer 282 can be recessed (i.e., etched back) and a dielectric cap layer can be deposited over the partially completed structure so as to fill the recesses formed above conductive fill material layer 282. Then, a polishing process (e.g., a CMP process) can be performed so as to remove any of the dielectric cap material from above the top surface of the ILD layer 296, thereby forming the dielectric gate caps 281.

Optionally, additional processing can be performed after recessing the conductive fill material layer 282 and in conjunction with formation of the dielectric gate caps in order to improve the quality of the material in the upper portion of the dielectric column 286 and/or to minimize capacitance between the RMGs 215, 255. For example, when the dielectric fill material deposited at process 134 to fill the trench 287 is a single layer of low density silicon nitride (or a conformal silicon nitride layer and a silicon oxide layer on the conformal silicon nitride layer), the dielectric fill material can be recessed below the level of the top surface of the conductive fill material layer 282 and a high density silicon nitride layer can be deposited and polished, thereby forming single dielectric structure that includes the dielectric gate caps and an additional dielectric cap (not shown) on the dielectric column 286 between the dielectric gate caps. Alternatively, when the dielectric fill material deposited at process 134 to fill the trench 287 includes a conformal silicon nitride layer and an amorphous silicon layer on the conformal silicon nitride layer, the dielectric fill material can be recessed below the level of the top surface of the conductive fill material layer 282, the amorphous silicon layer can be selectively removed and a high density silicon nitride layer can be deposited and polished, thereby forming single dielectric structure that includes the dielectric gate caps and, within the dielectric column 286, additional dielectric fill material (optionally including a void) (not shown).

Figure 18A:
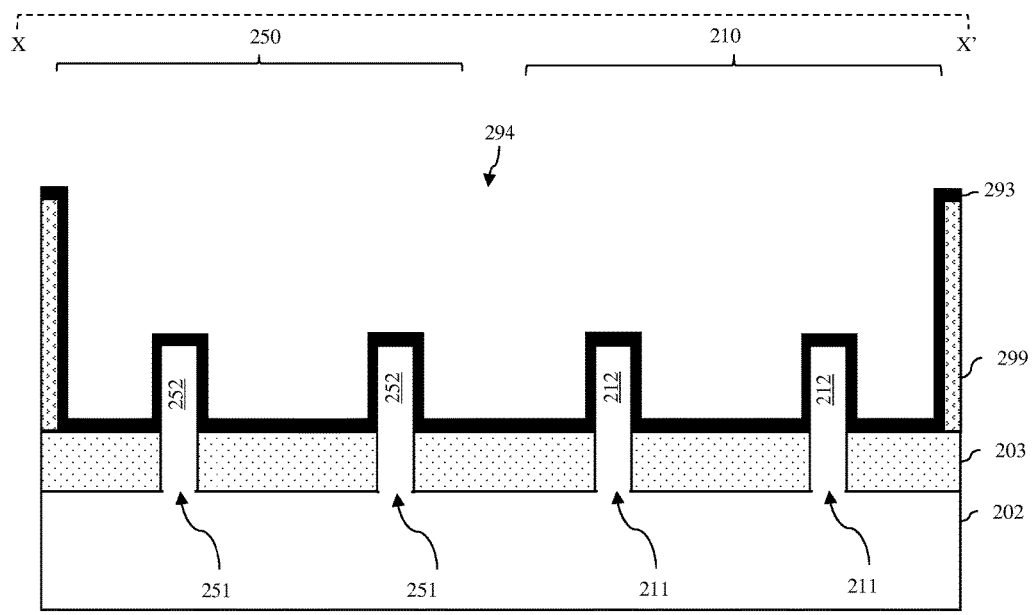
FIGS. 18A and 18B are different cross-section diagrams illustrating a partially completed structure formed according to a second embodiment of the method as shown in FIG. 1C.
Figure 18B:
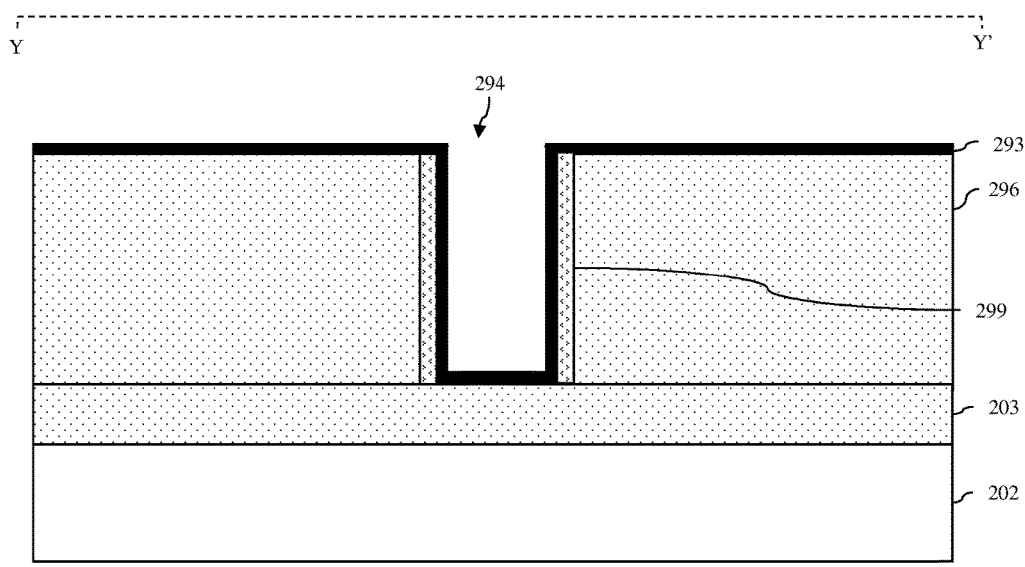

Alternatively, referring to FIG. 1C, in a second embodiment of the method, a gate dielectric layer and, particularly, a high-K gate dielectric layer 293 can be conformally deposited in the gate opening 294 (150, see FIGS. 18A-18B). An anneal process can subsequently be performed to improve the reliability of the high-K gate dielectric layer 293. For example, a conformal sacrificial titanium nitride layer can be deposited on the high-K gate dielectric layer 293 and a sacrificial amorphous silicon layer can be deposited onto the sacrificial titanium nitride layer (152). In one exemplary embodiment, the fin pitch can be approximately 15-25 nm (e.g., 20 nm), the thickness of the high-K gate dielectric layer 293 can be approximately 1-2 nm (e.g., 1.5 nm), the thickness of the sacrificial titanium nitride layer 292 can be approximately 1-2 nm (e.g., 1.5 nm) and the thickness of the sacrificial amorphous silicon layer 291 can be approximate 3-5 nm (e.g., 4 nm). The partially completed structure can then be subjected to an anneal (e.g., a laser anneal up to 1000° C.) in order to modify the molecular structure of the high-K gate dielectric layer so as to improve its reliability (e.g., to minimize gate leakage, negative bias temperature instability, etc.) (154). Following the anneal, the sacrificial amorphous silicon and titanium nitride layers can be selectively removed.

Subsequently, a first work function metal layer 284 can be conformally deposited so as to line the gate opening 294 (156). The metal material or metal alloy material of the conformal first work function metal layer 284 can be preselected in order to achieve the optimal gate conductor work function given the conductivity type of the first-type FINFET.

Following deposition of the conformal first work function metal layer 284, process flow A could be performed. Alternatively, following deposition of the conformal first work function metal layer 284, process flow B or process flow C could be performed. For purposes of illustration, process flow A is described in greater detail below and illustrated in the Figures.

Figure 19A:
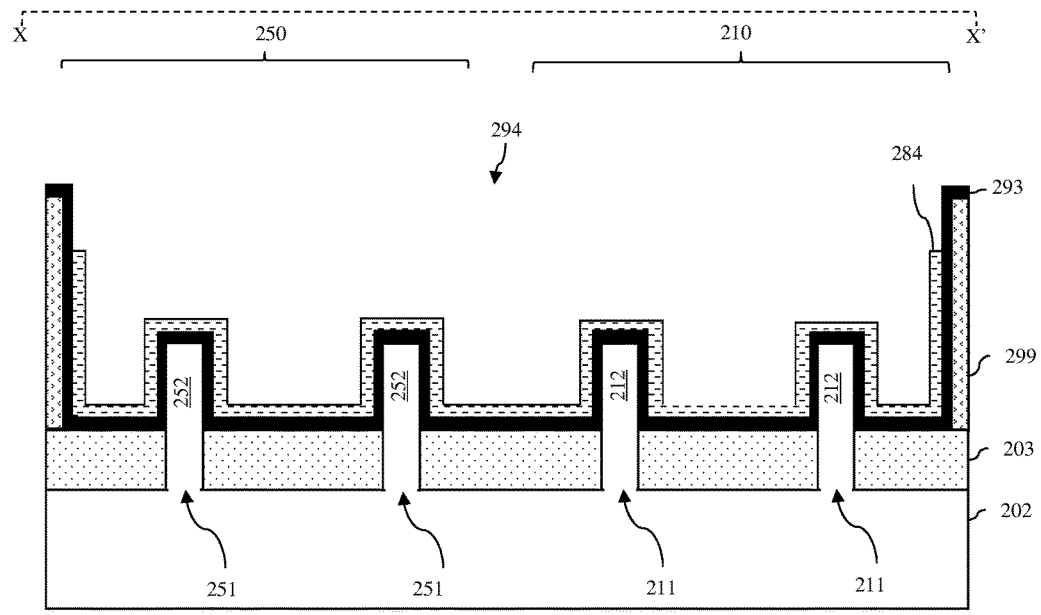
FIGS. 19A and 19B are different cross-section diagrams illustrating a partially completed structure formed according to the second embodiment of the method as shown in FIG. 1C.
Figure 19B:
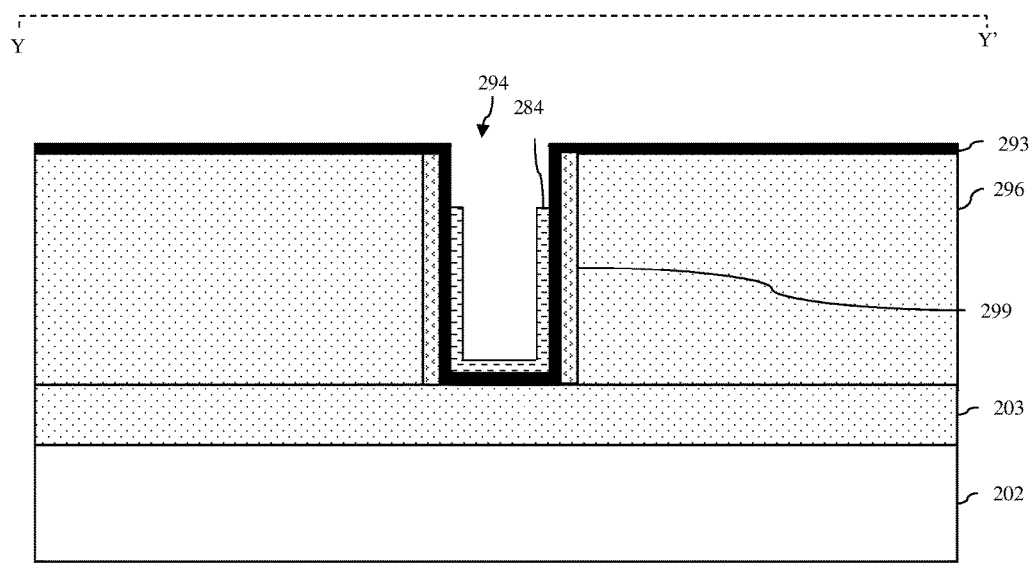

Specifically, the first work function metal layer 284 can be chamfered (161, see FIGS. 19A-19B). The chamfering process can include: depositing a protective fill material onto the first work function metal layer in the two portions of the gate opening; recessing the protective fill material; etching away the exposed first work function metal material from above the protective fill material such that the maximum height of the first work function metal layer is above the level of the top surface of the ILD layer 296; and removing the protective fill material.

Figure 20A:
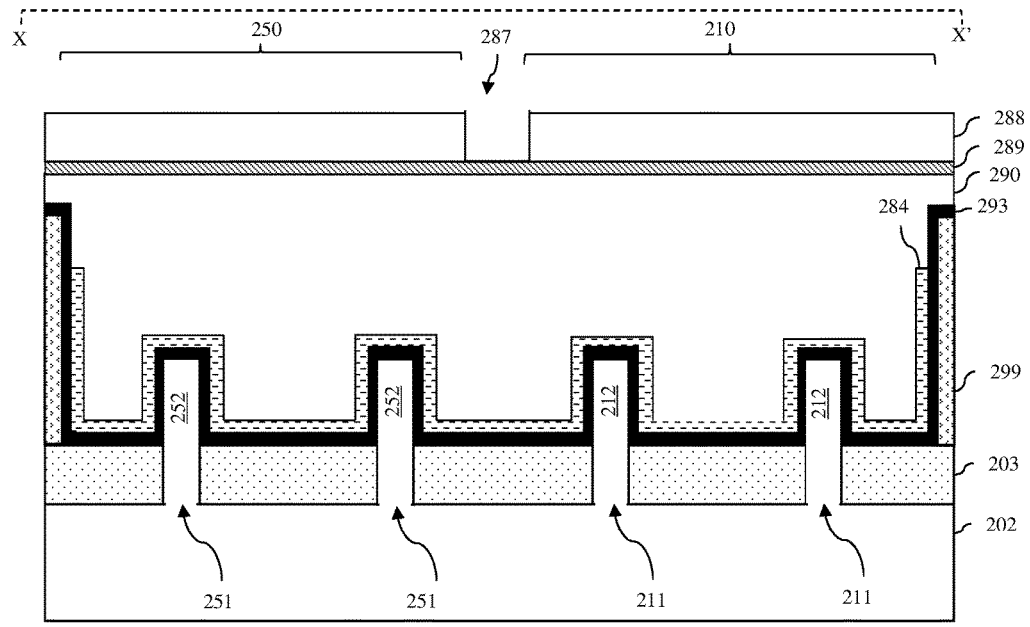
FIGS. 20A and 20B are different cross-section diagrams illustrating a partially completed structure formed according to the second embodiment of the method as shown in FIG. 1C.
Figure 20B:
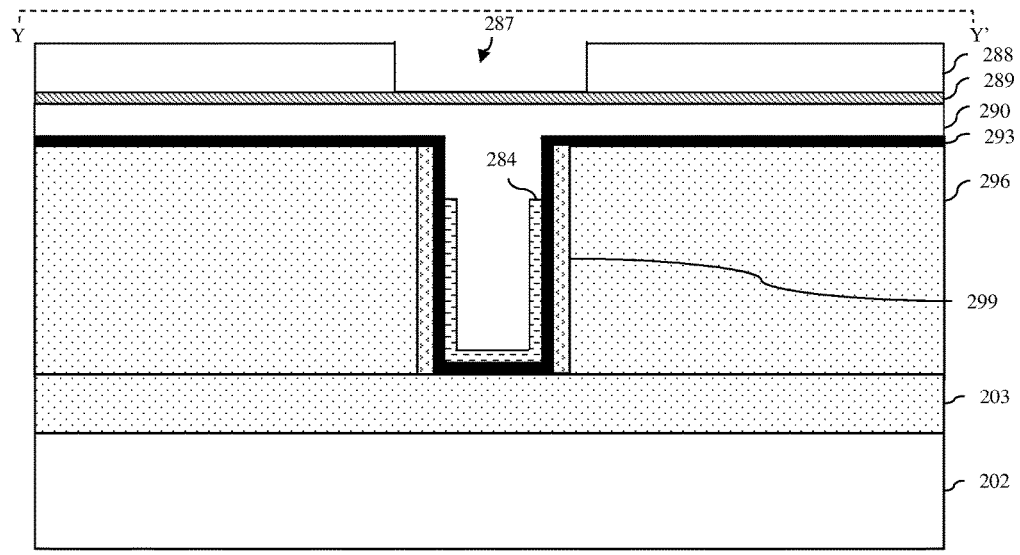
Figure 21A:
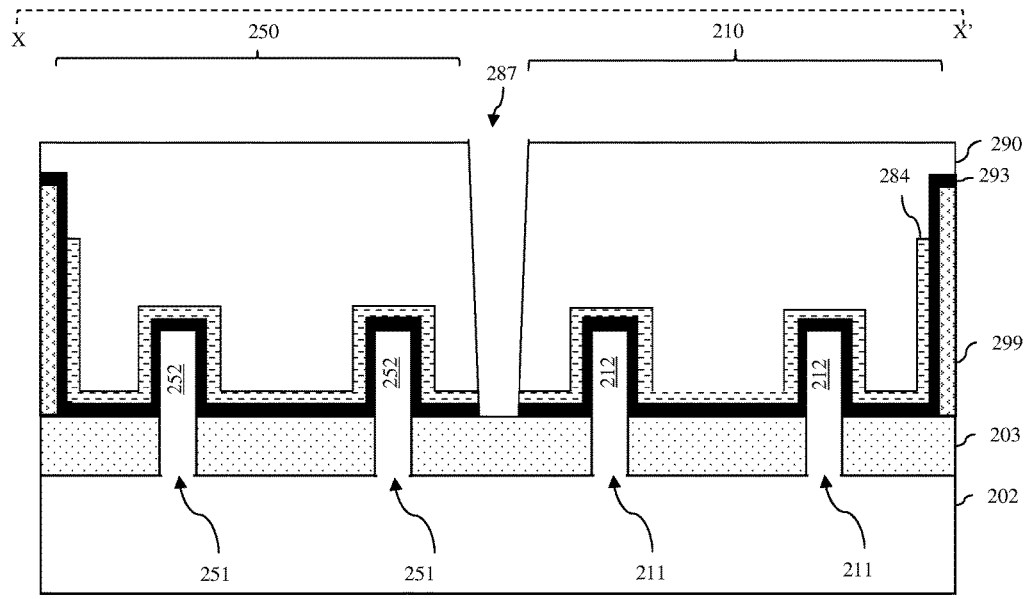
FIGS. 21A and 21B are different cross-section diagrams illustrating a partially completed structure formed according to the second embodiment of the method as shown in FIG. 1C.
Figure 21B:
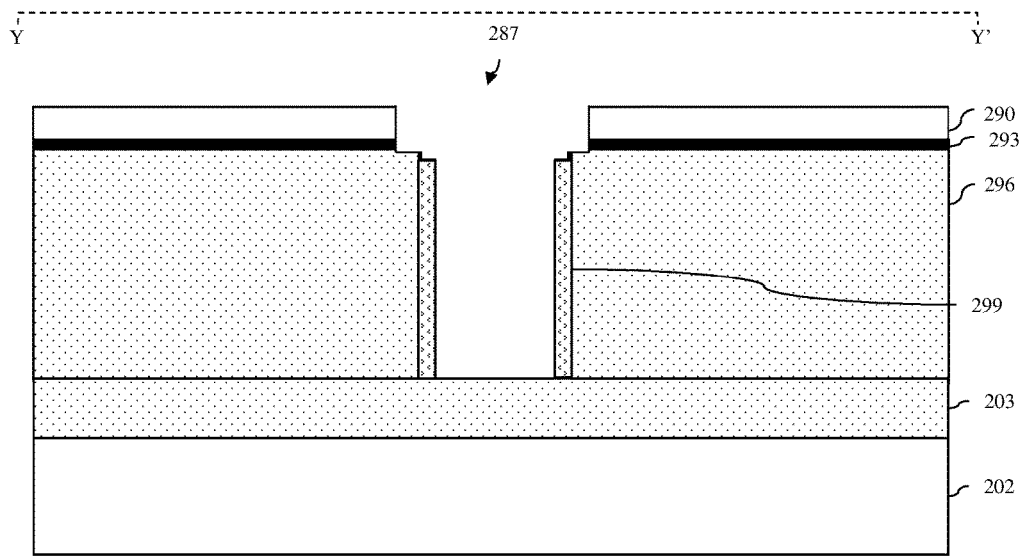

A mask layer 290 can be formed in the gate opening 294 on the first work function metal layer 284 (162) and a trench (referred to herein as a gate cut trench) can be formed in the mask layer 290, as described in greater detail below (163). Specifically, a mask layer 290 (e.g., an optical planarization layer (OPL)) can be deposited (e.g., using a spin-on process) so as to fill the gate opening and cover the top surface of the ILD layer. The mask layer 290 can be polished (e.g., using a CMP process). Optionally, the mask layer 290 can further be etched back and additional OPL material can be re-deposited to improve uniformity. Then, an anti-reflective coating (ARC) 289 can be formed on the top surface of the mask layer 290 and a photoresist layer 288 can be formed on the ARC 289. The photoresist layer 288 can be patterned with a shape. This shape can be positioned above the isolation region 203 between the first semiconductor fin(s) 211 and the second semiconductor fin(s) 251 and can extend across the full width of the gate opening so as to overlap the dielectric gate sidewall spacer 299 (see FIGS. 20A-20B). An anisotropic etch process can then be performed to transfer an image of the shape through the ARC 289 and an additional anisotropic etch processes can be performed to transfer the image of the shape into and through the mask layer 290, the first work function metal layer 284 and the high-K gate dielectric layer 293. It should be noted that, if the photoresist layer and the mask layer are organic materials, the anisotropic etch process used to transfer the image of the shape through the mask layer will also remove the photoresist layer. Then, any remaining material above the mask layer 290 and, specifically, the ARC 289 can be removed (see FIGS. 21A-21B). Thus, the resulting trench 287 extends essentially vertically through the mask layer 290, the first work function metal layer 284 and the high-K gate dielectric layer 293 to the isolation region 203 and is essentially parallel to and positioned laterally between the first semiconductor fin(s) 211 and the second semiconductor fin(s) 251. In a first direction, as shown in FIG. 21A, opposing sidewalls of the trench 287 are defined by essentially vertical surfaces of the mask layer 290 and in a second direction, as shown in FIG. 21B, opposing sidewalls of the trench 287 are defined by essentially vertical surfaces of the gate sidewall spacer 299. It should be noted that the etch processes used to form the trench 287 may result in divots in the top surface of the ILD layer 296; however, these divots are relatively small as compared to the divots that are developed using prior art techniques.

Figure 22A:
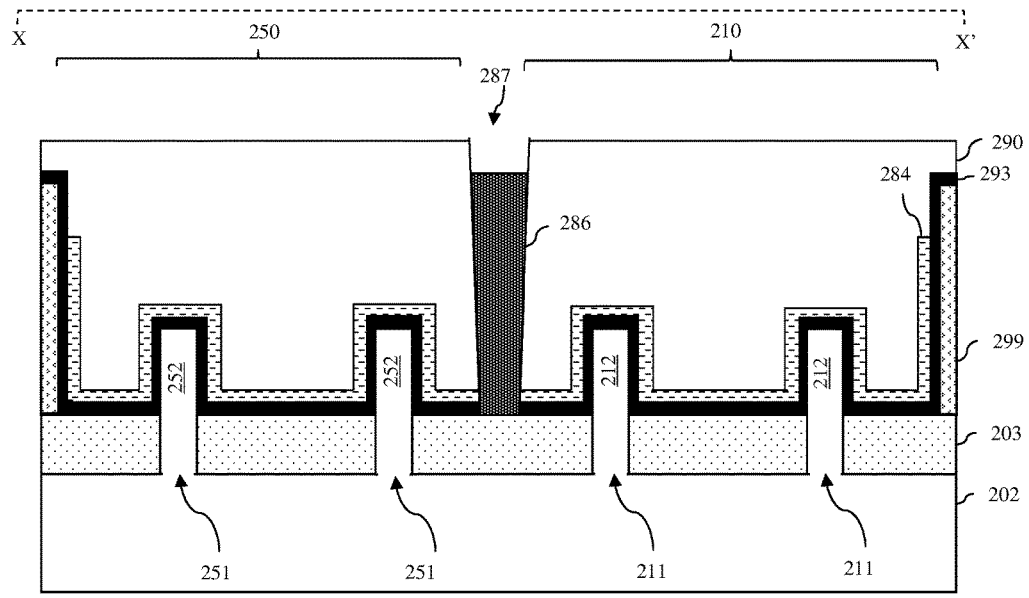
FIGS. 22A and 22B are different cross-section diagrams illustrating a partially completed structure formed according to the second embodiment of the method as shown in FIG. 1C.
Figure 22B:
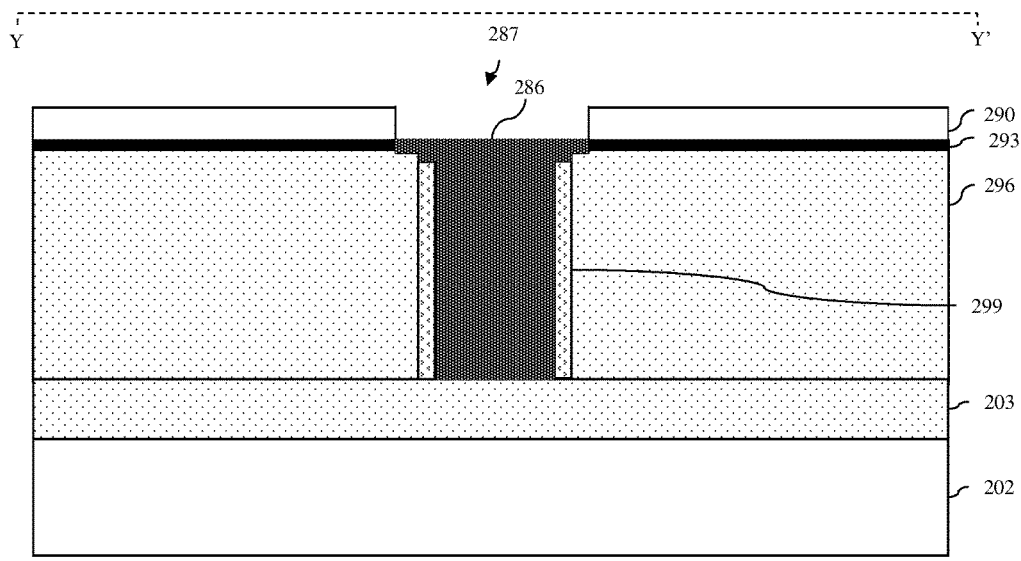
Figure 23A:
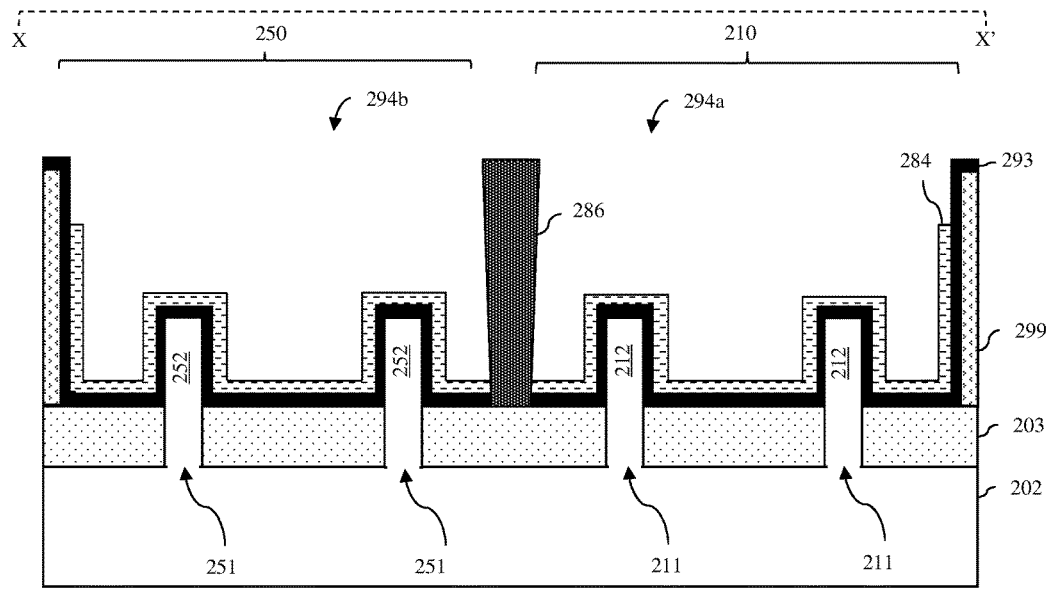
FIGS. 23A and 23B are different cross-section diagrams illustrating a partially completed structure formed according to the second embodiment of the method as shown in FIG. 1C.
Figure 23B:
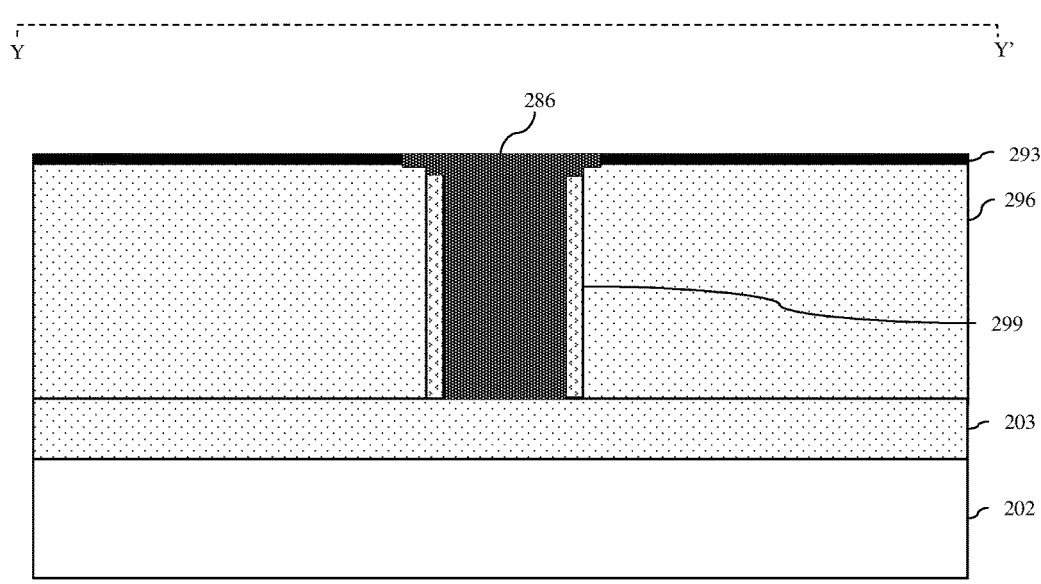

After the trench 287 is formed, a dielectric column 286 can be formed within the trench 287 (164, see FIGS. 22A-22B). To form the dielectric column, at least one layer of dielectric fill material can be deposited so as to fill the trench 287. In one embodiment, the dielectric fill material can be, for example, a single layer of silicon nitride, as illustrated. Alternatively, the dielectric fill material can be one or more layers of any other suitable dielectric material (e.g., silicon oxide, silicon oxynitride, etc.) (not shown). For example, in other embodiments, the dielectric fill material can include a conformal silicon nitride layer that lines the trench 287 and a silicon oxide layer, an undoped amorphous silicon layer, or any other suitable layer on the conformal silicon nitride layer. Next, the dielectric fill material can be removed from above the mask layer 290 (e.g., using polishing process, such as a CMP process, or an etch back process) and the remaining portion of the dielectric fill material can be recessed within the trench 287 to adjust the height of the resulting dielectric column 286 so that the top surface of the dielectric column 286 is at or above the level of the top surface of the ILD layer 296. The mask layer 290 (e.g., the OPL) can then be selectively removed in order to divide the gate opening 294 into a first portion 294a and a second portion 294b on opposing sides of the dielectric column 286 (165, see FIGS. 23A-23B).

Figure 24:
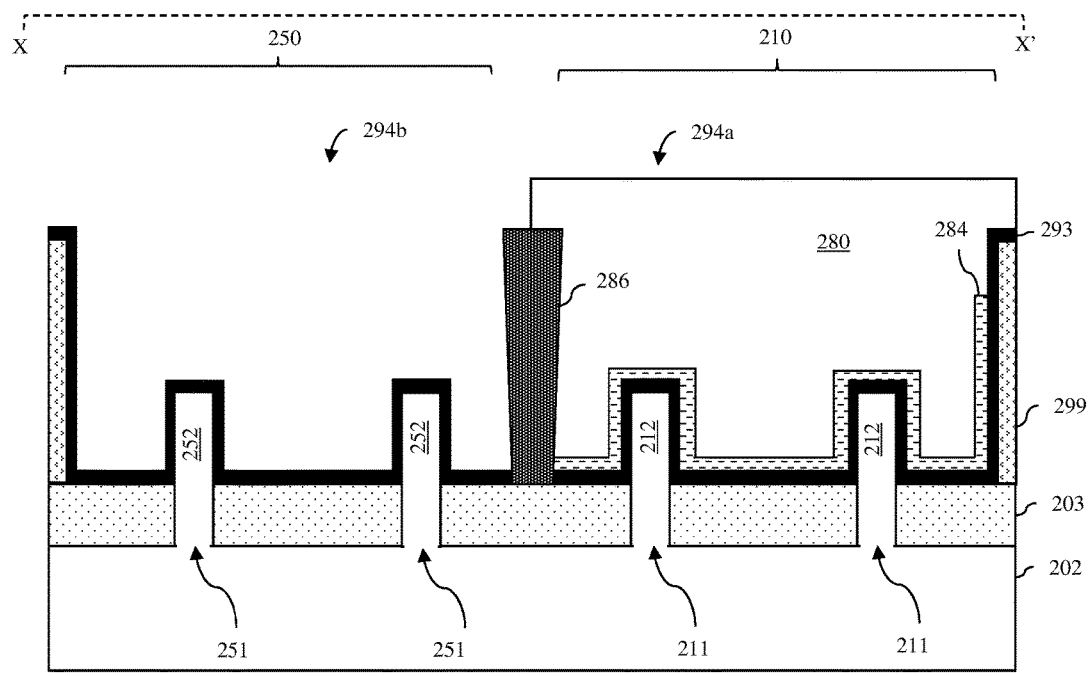
FIG. 24 is a cross-section diagram illustrating a partially completed structure formed according to the second embodiment of the method as shown in FIG. 1B.

After the mask layer 290 is removed, a protective mask 280 can be formed over first device region and the first work function metal layer 284 can be removed (e.g., selectively etched away) from the second portion 294b of the gate opening (166, see FIG. 24). The protective mask 280 can then be removed.

Alternatively, process flow B can be performed, wherein the mask layer is formed prior to chamfering the first work function metal layer. That is, in process flow B, after the first work function metal layer is formed at process 156, the following steps are performed: a mask layer is formed in the gate opening on the first work function metal layer; a trench is formed through the mask layer; a dielectric column is formed in the trench; the mask layer is removed to divide the gate opening into a first portion and a second portion on opposing sides of the dielectric column; the first work function metal layer is chamfered; and the first work function metal layer is removed from the second portion of the gate opening. Alternatively, process flow C can be performed, wherein the mask layer is formed after the first work function metal layer is removed from the second portion of the gate opening. That is, in process flow C, after the first work function metal layer is formed at process 156, the following steps are performed: the first work function metal layer is chamfered; the first work function metal layer is removed from the second device region; a mask layer is formed in the gate opening; a trench is formed through the mask layer; a dielectric column is formed in the trench; and the mask layer is removed to divide the gate opening into a first portion and a second portion on opposing sides of the dielectric column.

Figure 25:
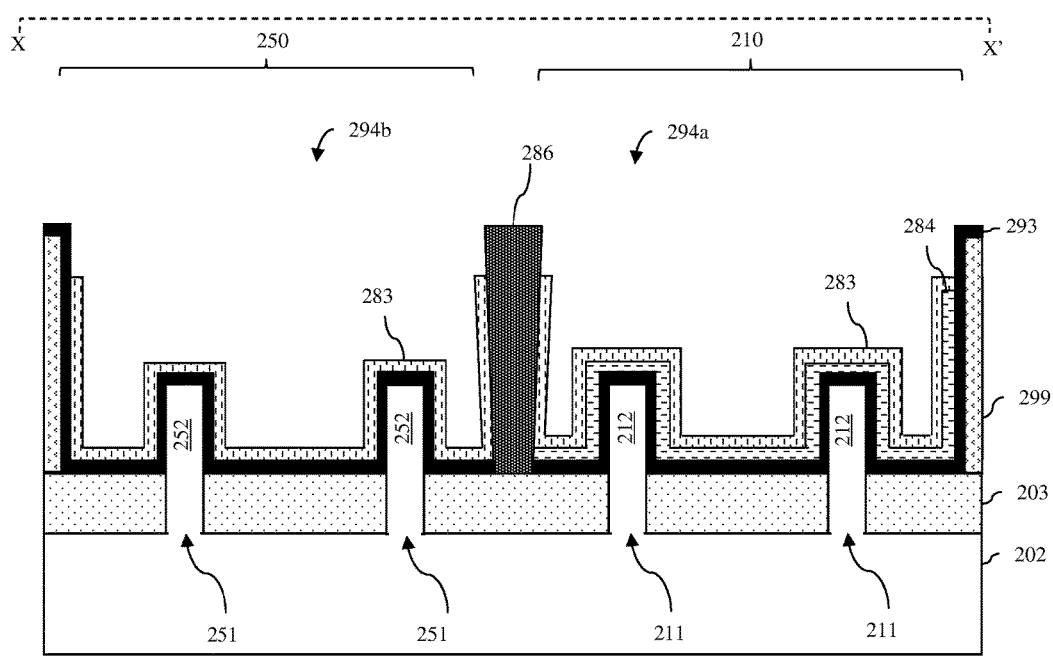
FIG. 25 is a cross-section diagram illustrating a partially completed structure formed according to the second embodiment of the method as shown in FIG. 1B.

In any case, after process flow A, B or C is performed, a second work function metal layer 283 can be conformally deposited so as to line the two portions 294a-b of the gate opening and the second work function metal layer 283 can be chamfered (170, see FIG. 25). The metal material or metal alloy material of the conformal second work function metal layer 283 can be preselected in order to achieve the optimal gate conductor work function given the conductivity type of the second-type FINFET. The chamfering process can include: depositing a protective fill material onto the second work function metal layer in the two portions of the gate opening; recessing the protective fill material; etching away the exposed second work function metal material from above the protective fill material such that the maximum height of the second work function metal layer 283 is some distance below the top surface of the ILD layer 296; and removing the protective fill material.

Figure 26:
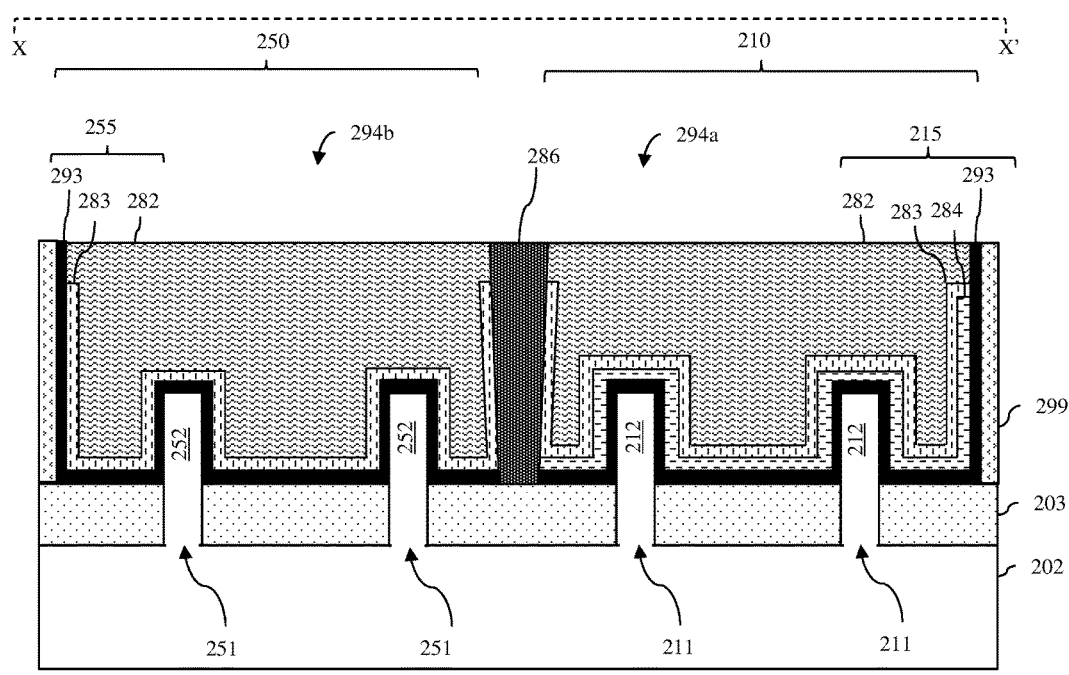
FIG. 26 is a cross-section diagram illustrating a partially completed structure formed according to the second embodiment of the method as shown in FIG. 1B; and, FIGS. 27A and 27B are different cross-section diagrams illustrating a structure 200B formed according to the second embodiment of the method as shown in FIG. 1C.

A conductive fill material layer 282 can then be deposited to fill any remaining space in the two portions 294a-b of the gate opening (172) and a polishing process (e.g., a CMP process) can be performed to remove any RMG materials from above the top surface of the ILD layer 296 (174, see FIG. 26).

Figure 27A:
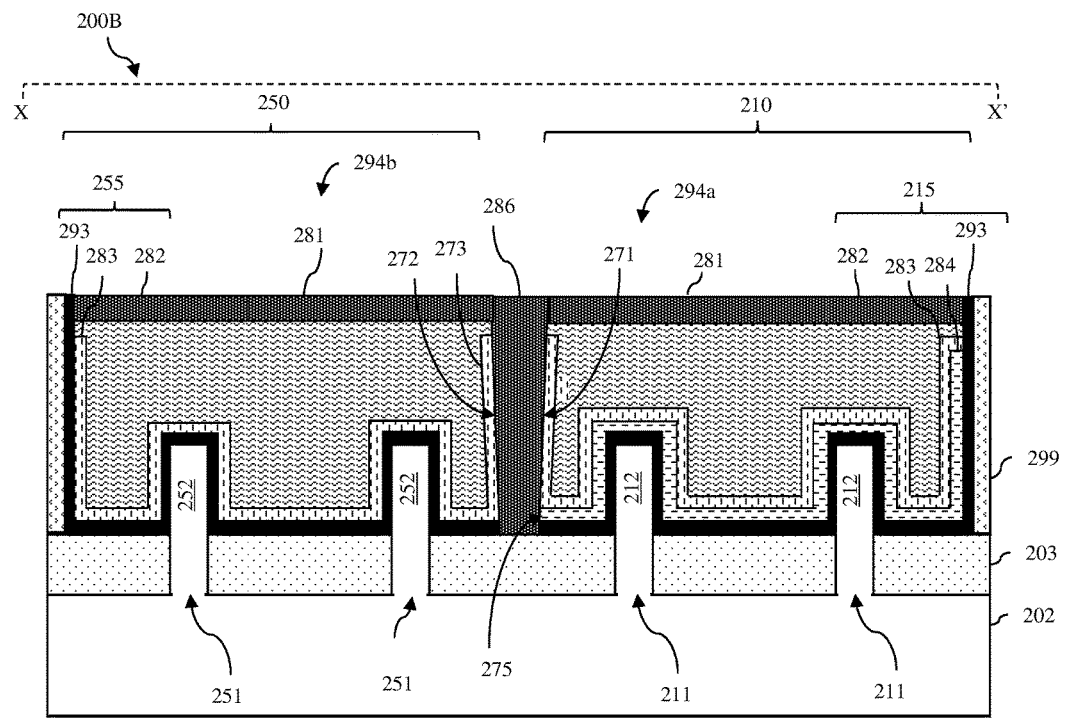
Figure 27B:
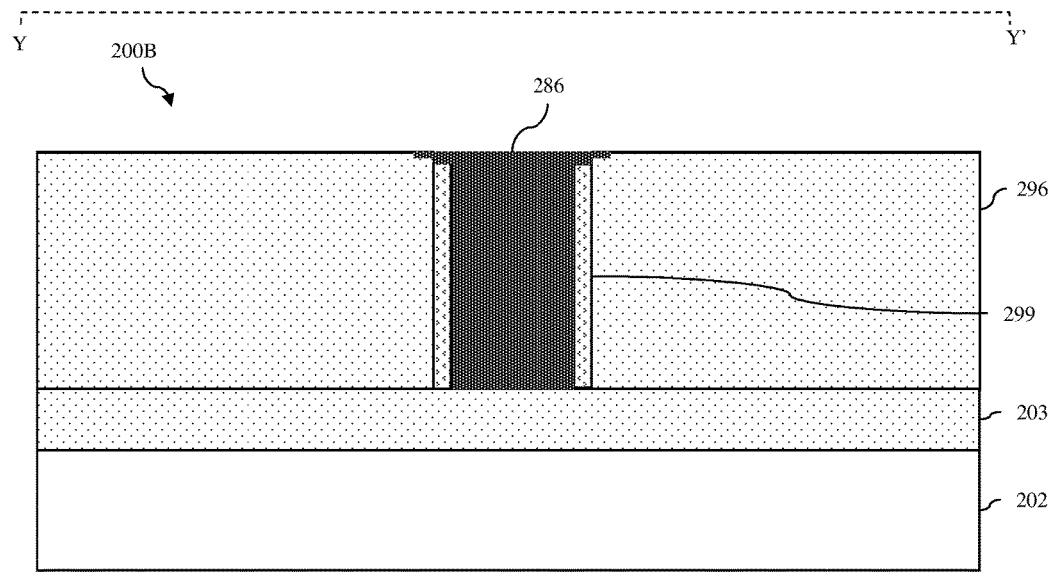

After the polishing process, dielectric gate caps 281 can be formed on the first RMG 215 in the first portion 294a of the gate opening and on the second RMG 255 in the second portion 294b of the gate opening (176, see FIGS. 27A-27B). For example, at process 176, the conductive fill material layer 282 can be recessed (i.e., etched back) and a dielectric cap layer can be deposited over the partially completed structure so as to fill the recesses above the conductive fill material layer 282. Next, a polishing process (e.g., a CMP process) can be performed so as to remove any of the dielectric cap material from above the top surface of the ILD layer 296, thereby forming the dielectric gate caps 281.

As with the previously described method embodiment, additional processing can be performed after recessing the conductive fill material layer 282 and in conjunction with formation of the dielectric gate caps 281 in order to improve the quality of the material in the upper portion of the dielectric column 286 and/or to minimize capacitance between the RMGs 215, 255. For example, when the dielectric fill material deposited at process 134 to fill the trench 287 is a single layer of low density silicon nitride (or a conformal silicon nitride layer and a silicon oxide layer on the conformal silicon nitride layer), the dielectric fill material can be recessed below the level of the top surface of the conductive fill material layer 282 and a high density silicon nitride layer can be deposited and polished, thereby forming single dielectric structure that includes the dielectric gate caps and an additional dielectric cap (not shown) on the dielectric column 286 between the dielectric gate caps. Alternatively, when the dielectric fill material deposited at process 134 to fill the trench 287 includes a conformal silicon nitride layer and an amorphous silicon layer on the conformal silicon nitride layer, the dielectric fill material can be recessed below the level of the top surface of the conductive fill material layer 282, the amorphous silicon layer can be selectively removed and a high density silicon nitride layer can be deposited and polished, thereby forming single dielectric structure that includes the dielectric gate caps and, within the dielectric column 286, additional dielectric fill material (optionally including a void) (not shown).

In any case, by forming the dielectric column 286 after deposition and anneal of the gate dielectric layer, but before deposition of one or more of the multiple work function metal layers, as described in the various embodiments of the method above, the method minimizes the risk of the occurrence defects within the first RMG 215 and the second RMG 255, even with relatively small devices and a relatively high device density.

Referring to FIGS. 17A-17B and 27A-27B, also disclosed herein are integrated circuit (IC) structure embodiments 200A and 200B, respectively, which are formed according to the above-described method embodiments. Each of the IC structure embodiments 200A, 200B include at least a first-type FINFET 210 (e.g., a P-type FINFET) and a second-type FINFET 250 (e.g., an N-type FINFET).

The first-type FINFET 210 and the second-type FINFET 250 can be formed using a bulk semiconductor wafer 202 (e.g., a bulk silicon wafer or other suitable bulk semiconductor wafer), as illustrated. Alternatively, the first-type FINFET 210 and the second-type FINFET 250 can be formed using a semiconductor layer of a semiconductor-on-insulator wafer (e.g., a silicon-on-insulator (SOI) wafer).

The first-type FINFET 210 can include one or more first semiconductor fins 211. Each semiconductor fin 211 can include first source/drain regions 213 with a first-type conductivity and a first channel region 212 with a second type conductivity positioned laterally between the first source/drain regions 213. For example, if the first-type FINFET is a P-type FINFET, the first source/drain regions 213 can be P+ source/drain regions and the first channel region 212 can be a N-channel region.

The second-type FINFET 250 can include one or more second semiconductor fins 251. Each second semiconductor fin 251 can include second source/drain regions 253 with the second-type conductivity and a second channel region 252 with a first-type conductivity positioned laterally between the second source/drain regions 253. For example, if the second-type FINFET is an N-type FINFET, the second source/drain regions 253 can be N+ source/drain regions and the second channel region 252 can be a P-channel region.

It should be noted that, if the semiconductor wafer on which the semiconductor fins 211, 251 are formed is a bulk semiconductor wafer, an isolation region 203 (e.g., a silicon oxide isolation region) can be positioned around the lower portion of each semiconductor fin and can extend laterally between adjacent semiconductor fins. However, if the semiconductor wafer on which the semiconductor fins 211, 251 are formed is an SOI wafer, the semiconductor fins 211, 251 can extend essentially vertically upward from the top surface of an insulator layer such that portions of the insulator layer function as an isolation region extending laterally between adjacent semiconductor fins.

The first-type FINFET 210 can further include a first replacement metal gate (RMG) 215 adjacent to each first channel region 212 and, particularly, on the first top surface and first opposing sides of each first semiconductor fin 211 at the first channel region 212. The second-type FINFET 250 can similarly include a second RMG 255 adjacent to each second channel region 252 and, particularly, on the second top surface and second opposing sides of each second semiconductor fin 251 at the second channel region 252.

The first RMG 215 can be in end-to-end alignment with the second RMG 255. Additionally, the first RMG 215 can be physically separated and electrically isolated from the second RMG 255 by a dielectric column 286, which has a first side 271 and a second side 272 opposite the first side 271. The dielectric column 286 can be a solid column made of a single dielectric material. For example, in one embodiment, the dielectric column 286 can be a solid silicon nitride column, as illustrated. In other embodiments, the dielectric column 286 can include one or more layers of different dielectric materials. For example, the dielectric column 286 could include a low density silicon nitride layer on the bottom surface and sidewalls and either a silicon oxide center portion and a silicon nitride cap (not shown) or a high density silicon nitride center with an optional void (not shown).

The first RMG 215 can include portions of a gate dielectric layer 293, a first work function metal layer 284, a second work function metal layer 283, and a conductive fill material layer 282. Each of the portions of the various layers can have surfaces immediately adjacent to the first side 271 of the dielectric column 286.

The second RMG 255 can include additional portions of the same layers except for the first work function metal layer. That is, the second RMG 255 can include additional portions of the gate dielectric layer 293, the second work function metal layer 283 and the conductive fill material layer 282 and each of the additional portions of the various layers can have surfaces immediately adjacent to the second side 272 of the dielectric column 286. Furthermore, the additional portion of the second work function metal layer 283 within the second RMG 255 can specifically have a segment 273, which is essentially parallel and immediately adjacent to the second side 272 of the dielectric column 286 and which extends from the top surface of the high-K gate dielectric layer 293 to above the level of the second top surface(s) of the second semiconductor fin(s) 251. In other words, the additional portion of the second work function metal layer 283 within the second RMG 255 can have an essentially vertically orient segment 273, which extends essentially vertically along the second side 272 of the dielectric column 286 and which has a height that is greater than the height of the second semiconductor fin(s) 251.

It should be noted that the configuration of the first RMG 215 may vary depending upon the embodiment. For example, as illustrated in the IC structure embodiment 200A of FIGS. 17A-17B, the portion of the first work function metal layer 284 within the first RMG 215 can have a segment 274, which is essentially parallel and immediately adjacent to the first side 271 of the dielectric column 286 and which extends from the top surface of the gate dielectric layer 293 to above the level of the first top surface(s) of the first semiconductor fin(s) 211. In other words, the portion of the first work function metal layer 284 with the first RMG 215 can have an essentially vertically oriented segment 274, which extends essentially vertically along the first side 271 of the dielectric column 286 and which has a height that is greater than the height of the first semiconductor fin(s) 211.

Alternatively, as illustrated in the IC structure embodiment 200B of FIGS. 27A-27B, the portion of the first work function metal layer 284 within the first RMG 215 can have an end 275 that abuts the first side 271 of the dielectric column 286 as opposed to a segment that is parallel and immediately adjacent to the first side).

In any case, in the RMGs described above, the gate dielectric layer 293 can be a high-K gate dielectric layer. The first work function metal layer 284 can be made of a metal material or metal alloy material preselected to have a first work function, which is optimal for performance of the first-type FINFET 210. The second work function metal layer 283 can be made of a metal material or metal alloy material preselected to have a second work function, which is different from the first work function and which is optimal for performance of the second-type FINFET 250. The conductive fill material layer 282 can be a layer of any suitable conductive fill material.

The IC structure embodiments 200A and 200B can further include a dielectric gate sidewall spacer 299, dielectric gate caps 281, and an interlayer dielectric (ILD) layer 296. The dielectric gate sidewall spacer 299 can laterally surround the outer sidewalls of the first RMG 215, the dielectric column 286 and the second RMG 255. The dielectric gate sidewall spacer 299 can be, for example, a silicon nitride gate sidewall spacer. The dielectric gate caps 281 can be on the RMGs 215, 255 and, particularly, on the top surface of the conductive fill material layer 282 of each RMG. The dielectric gate caps 281 can be, for example, silicon nitride gate caps. The ILD layer 296 can be positioned laterally immediately adjacent to the outer sidewalls of the gate sidewall spacer 299 and can further cover the portions of the semiconductor fins 211, 251 that extend laterally beyond the RMGs. That is, the ILD layer 296 can cover the first source/drain regions 213 of the first-type FINFET 210 and the second source/drain regions 252 of the second-type FINFET 250. The ILD layer 296 can be, for example, a silicon oxide layer or a layer of some other suitable ILD material (e.g., borophosphosilicate glass (BPSG), tetraethyl orthosilicate (TEOS), fluorinated tetraethyl orthosilicate (FTEOS), etc.).

In the method and structure embodiments described above different dopants can be used to achieve the different type conductivities in different regions of the semiconductor fins 211, 251, as described. Those skilled in the art will recognize that different dopants can be used to achieve the different type conductivities and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels will depend upon the relative concentration levels of the dopants.

Also, in the method and structure embodiments described above, a high-K gate dielectric layer refers to a layer of dielectric material with a dielectric constant that is greater than the dielectric constant of silicon dioxide (i.e., greater than 3.9). Exemplary high-K dielectric materials that can be used for the gate dielectric layer 293 can include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Additionally, in the method and structure embodiments described above, the first work function metal layer 284 is preselected to have a first work function optimal for performance of the first-type FINFET 210 (e.g., a P-type FINFET) and the second work function metal layer 283 is preselected to have a second work function optimal for performance of the second-type FINFET 250 (e.g., an N-type FINFET). Those skilled in the art will recognize that the optimal work function for a gate conductor of a P-type FET will be, for example, between about 4.9 eV and about 5.2 eV. Exemplary metals (and metal alloys), which have a work function within this range and which, thus, can be used for the first work function metal layer 284 include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Those skilled in the art will further recognize that the optimal work function for a gate conductor of an N-type FET will be, for example, between 3.9 eV and about 4.2 eV. Exemplary metals (and metal alloys), which have a work function within this range and which, thus, can be used for the second work function metal layer 283, include, but are not limited to, hafnium, zirconium, titanium, tantalum, aluminum, and alloys thereof, such as, hafnium carbide, zirconium carbide, titanium carbide, tantalum carbide, and aluminum carbide. Finally, in the method and structure embodiments described above, the conductive fill material layer 282 can be any suitable metal or metal alloy fill material including, but not limited to, tungsten, a tungsten alloy (e.g., tungsten silicide or titanium tungsten), cobalt, or aluminum.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are embodiments of a method of forming an integrated circuit (IC) structure with at least one first-type FINFET (e.g., a P-type FINFET) and at least one second-type FINFET (e.g., an N-type FINFET), wherein the first-type FINFET has a first replacement metal gate (RMG) adjacent to at least one first semiconductor fin, wherein the second-type FINFET has a second RMG adjacent to at least one second semiconductor fin, and wherein the first RMG is in end-to-end alignment with the second RMG and physically and electrically isolated from the second RMG by a dielectric column. The disclosed embodiments of the method minimize the risk of the occurrence defects within the RMGs, even with relatively small devices and a relatively high device density, by forming the dielectric column during formation of the first and second RMGs and, particularly, after deposition and anneal of a gate dielectric layer for the first and second RMGs, but before deposition of at least one of multiple work function metal layers. Also disclosed above are embodiments of an IC structure formed according to the above-described method embodiments.

What is claimed is:

1. A method comprising:
    selectively removing a sacrificial gate to create a gate opening that exposes a first channel region of a first semiconductor fin and a second channel region of a second semiconductor fin; and
    forming, in the gate opening, a first replacement metal gate adjacent to the first channel region, a second replacement metal gate adjacent to the second channel region and a dielectric column between the first replacement metal gate and the second replacement metal gate,
    the dielectric column being formed during formation of the first replacement metal gate and the second replacement metal gate after deposition of a gate dielectric layer into the gate opening and before deposition of at least one of multiple work function metal layers.

2. The method of claim 1, the gate dielectric layer comprising a high-K gate dielectric layer and the dielectric column being formed after an anneal process is performed to improve reliability of the high-K gate dielectric layer.

3. The method of claim 1, the forming of the first replacement metal gate adjacent to the first channel region, the second replacement metal gate adjacent to the second channel region, and the dielectric column between the first replacement metal gate and the second replacement metal gate comprising:
    depositing the gate dielectric layer to line the gate opening, the gate dielectric layer comprising a high-K gate dielectric layer;
    performing an anneal process to improve reliability of the high-K gate dielectric layer;
    after the anneal process, forming a mask layer in the gate opening;
    forming a trench that extends essentially vertically through the mask layer to an isolation region such that the trench is essentially parallel to and positioned laterally between the first semiconductor fin and the second semiconductor fin;
    forming the dielectric column in the trench; and,
    selectively removing the mask layer to divide the gate opening into a first portion and a second portion on opposing sides of the dielectric column.

4. The method of claim 3, the forming of the dielectric column in the trench comprising:
    depositing a dielectric fill material layer to fill the trench;
    removing the dielectric fill material layer from above the mask layer; and
    recessing the dielectric fill material layer to adjust a height of the dielectric column.

5. The method of claim 4, the dielectric fill material layer comprising a silicon nitride layer.

6. The method of claim 3, the forming of the first replacement metal gate adjacent to the first channel region, the second replacement metal gate adjacent to the second channel region, and the dielectric column between the first replacement metal gate and the second replacement metal gate further comprising:
    conformally depositing a first work function metal layer;
    chamfering the first work function metal layer;
    removing the first work function metal layer from the second portion of the gate opening;
    conformally depositing a second work function metal layer;
    chamfering the second work function metal layer;
    depositing a conductive fill material layer to fill any remaining space in the first portion and in the second portion of the gate opening;
    recessing the conductive fill material to complete formation of the first replacement metal gate in the first portion of the gate opening and the second replacement metal gate in the second portion of the gate opening; and,
    forming dielectric gate caps on the conductive fill material layer in the first portion and the second portion of the gate opening.

7. The method of claim 6, further comprising:
    before the performing of the anneal process, depositing a sacrificial titanium nitride layer onto the high-K gate dielectric layer and a sacrificial amorphous silicon layer onto the sacrificial titanium nitride layer;
    before the forming of the mask layer, removing the sacrificial amorphous silicon layer; and,
    after the removing of the mask layer and before the depositing of the first work function metal layer, removing the sacrificial titanium nitride layer.

8. A method comprising:
    selectively removing a sacrificial gate to create a gate opening that exposes a first channel region of a first semiconductor fin and a second channel region of a second semiconductor fin; and forming, in the gate opening, a first replacement metal gate adjacent to the first channel region, a second replacement metal gate adjacent to the second channel region, and a dielectric column between the first replacement metal gate and the second replacement metal gate, the dielectric column being formed during formation of the first replacement metal gate and the second replacement metal gate after deposition of a gate dielectric layer into the gate opening, after deposition of a first work function metal layer and before deposition of a second work function metal layer.

9. The method of claim 8, the gate dielectric layer comprising a high-K gate dielectric layer and the dielectric column being formed after an anneal process is performed to improve reliability of the high-K gate dielectric layer.

10. The method of claim 8, the forming of the first replacement metal gate adjacent to the first channel region, the second replacement metal gate adjacent to the second channel region, and the dielectric column between the first replacement metal gate and the second replacement metal gate comprising:
 depositing the gate dielectric layer to line the gate opening, the gate dielectric layer comprising a high-K gate dielectric layer;
 performing an anneal process to improve reliability of the high-K gate dielectric layer;
 conformally depositing the first work function metal layer in the gate opening on the high-K gate dielectric layer;
 chamfering the first work function metal layer;
 forming a mask layer on the first work function metal layer;
 forming a trench that extends essentially vertically through the mask layer, the first work function metal layer and the high-K gate dielectric layer to an isolation region, the trench being positioned laterally between the first semiconductor fin and the second semiconductor fin;
 forming the dielectric column in the trench; and,
 selectively removing the mask layer to divide the gate opening into a first portion and a second portion on opposing sides of the dielectric column.

11. The method of claim 10, the forming of the dielectric column in the trench comprising:
 depositing a dielectric fill material layer to fill the trench;
 removing the dielectric fill material layer from above the mask layer; and
 recessing the dielectric fill material layer to adjust a height of the dielectric column.

12. The method of claim 11, the dielectric fill material layer comprising a silicon nitride layer.

13. The method of claim 10, the forming of the first replacement metal gate adjacent to the first channel region, the second replacement metal gate adjacent to the second channel region, and the dielectric column between the first replacement metal gate and the second replacement metal gate further comprising:
 removing the first work function metal layer from the second portion of the gate opening;
 conformally depositing the second work function metal layer;
 chamfering the second work function metal layer;
 depositing a conductive fill material layer to fill any remaining space in the first portion and the second portion of the gate opening;
 recessing the conductive fill material to complete formation of the first replacement metal gate in the first portion of the gate opening and the second replacement metal gate in the second portion of the gate opening; and,
 forming dielectric gate caps on the conductive fill material layer in the first portion and the second portion of the gate opening.

14. The method of claim 10, further comprising:
 before the performing of the anneal process, depositing a sacrificial titanium nitride layer onto the high-K gate dielectric layer and a sacrificial amorphous silicon layer onto the sacrificial titanium nitride layer; and
 before the forming of the first work function metal layer, removing the sacrificial amorphous silicon layer and the sacrificial titanium nitride layer.

15. A method comprising:
 selectively removing a sacrificial gate to create a gate opening that exposes a first channel region of a first semiconductor fin and a second channel region of a second semiconductor fin; and
 forming, in the gate opening, a first replacement metal gate adjacent to the first channel region, a second replacement metal gate adjacent to the second channel region and a dielectric column between the first replacement metal gate and the second replacement metal gate,
 wherein the dielectric column is formed during formation of the first replacement metal gate and the second replacement metal gate after deposition of a gate dielectric layer and before deposition of at least one of multiple work function metal layers, and
 wherein the forming of the first replacement metal gate adjacent to the first channel region, the second replacement metal gate adjacent to the second channel region, and the dielectric column between the first replacement metal gate and the second replacement metal gate comprises:
  depositing the gate dielectric layer to line the gate opening, the gate dielectric layer comprising a high-K gate dielectric layer;
  performing an anneal process to improve reliability of the high-K gate dielectric layer;
  after the anneal process, forming a mask layer in the gate opening;
  forming a trench that extends essentially vertically through the mask layer to an isolation region such that the trench is essentially parallel to and positioned laterally between the first semiconductor fin and the second semiconductor fin;
  forming the dielectric column in the trench; and,
  selectively removing the mask layer to divide the gate opening into a first portion and a second portion on opposing sides of the dielectric column.

16. The method of claim 15, the gate dielectric layer comprising a high-K gate dielectric layer and the dielectric column being formed after an anneal process is performed to improve reliability of the high-K gate dielectric layer.

17. The method of claim 15, the forming of the dielectric column in the trench comprising:
 depositing a dielectric fill material layer to fill the trench;
 removing the dielectric fill material layer from above the mask layer; and
 recessing the dielectric fill material layer to adjust a height of the dielectric column.

18. The method of claim 15, the forming of the first replacement metal gate adjacent to the first channel region, the second replacement metal gate adjacent to the second channel region, and the dielectric column between the first replacement metal gate and the second replacement metal gate further comprising:
- conformally depositing a first work function metal layer;
- chamfering the first work function metal layer;
- removing the first work function metal layer from the second portion of the gate opening;
- conformally depositing a second work function metal layer;
- chamfering the second work function metal layer;
- depositing a conductive fill material layer to fill any remaining space in the first portion and in the second portion of the gate opening;
- recessing the conductive fill material to complete formation of the first replacement metal gate in the first portion of the gate opening and the second replacement metal gate in the second portion of the gate opening; and,
- forming dielectric gate caps on the conductive fill material layer in the first portion and the second portion of the gate opening.

19. The method of claim 18, further comprising:
- before the performing of the anneal process, depositing a sacrificial titanium nitride layer onto the high-K gate dielectric layer and a sacrificial amorphous silicon layer onto the sacrificial titanium nitride layer;
- before the forming of the mask layer, removing the sacrificial amorphous silicon layer; and,
- after the removing of the mask layer and before the depositing of the first work function metal layer, removing the sacrificial titanium nitride layer.

* * * * *